(12) United States Patent
Khajeh et al.

(10) Patent No.: US 10,949,030 B2
(45) Date of Patent: Mar. 16, 2021

(54) SHEAR-POLED CURVED PIEZOELECTRIC MATERIAL

(71) Applicant: Apple Inc., Cupertino, CA (US)

(72) Inventors: Ehsan Khajeh, San Jose, CA (US); Aaron Scott Tucker, Cupertino, CA (US); Brian Michael King, Saratoga, CA (US); Marcus Yip, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/123,757

(22) Filed: Sep. 6, 2018

(65) Prior Publication Data

US 2019/0095045 A1    Mar. 28, 2019

Related U.S. Application Data

(60) Provisional application No. 62/563,617, filed on Sep. 26, 2017.

(51) Int. Cl.
| | | |
|---|---|---|
| *G06F 3/043* | (2006.01) | |
| *G06F 3/041* | (2006.01) | |
| *G06F 1/3234* | (2019.01) | |

(52) U.S. Cl.
CPC .......... *G06F 3/0436* (2013.01); *G06F 1/3262* (2013.01); *G06F 3/04166* (2019.05);
(Continued)

(58) Field of Classification Search
CPC ........ G06F 3/016; G06F 3/0436; G06F 3/043; G06F 2203/014; G06F 2203/04809;
(Continued)

(56) References Cited

U.S. PATENT DOCUMENTS

| | | | | |
|---|---|---|---|---|
| 3,141,100 A | * | 7/1964 | Hart ....................... | H03H 9/545 |
| | | | | 310/323.01 |
| 3,673,327 A | | 6/1972 | Johnson | |

(Continued)

FOREIGN PATENT DOCUMENTS

| | | |
|---|---|---|
| CN | 104919407 A | 9/2015 |
| CN | 107249763 A | 10/2017 |

(Continued)

OTHER PUBLICATIONS

Final Office Action dated Feb. 20, 2013, for U.S. Appl. No. 12/184,232, filed Jul. 31, 2008, 24 pages.

(Continued)

*Primary Examiner* — Michael J Jansen, II
(74) *Attorney, Agent, or Firm* — Kubota & Basol LLP

(57) ABSTRACT

Acoustic transducers can be formed form piezoelectric materials including one or more curved (non-linear) segments. The piezoelectric material can be shear poled such that a poling direction of the piezoelectric material can follow the curvature of the piezoelectric material. The piezoelectric material can also have a unidirectional poling direction. In some examples, the piezoelectric material can be a closed ring with a circular or partially circular shape. A shear poling process for a piezoelectric material with curves can include shear poling segments of the piezoelectric material with one or more sets of poling electrodes. The poling electrodes of a respective one of the one or more sets of poling electrodes can be coupled to the same side of the piezoelectric material.

21 Claims, 14 Drawing Sheets

(52) U.S. Cl.
CPC .............. *G06F 2203/04104* (2013.01); *G06F 2203/04106* (2013.01)

(58) Field of Classification Search
CPC ...... G06F 3/0433; G06F 3/01; G06F 3/04166; G06F 1/3262; G06F 2203/04106; G06F 2203/04104; Y02D 10/00; H01L 41/0993; H01L 41/257
See application file for complete search history.

(56) References Cited

U.S. PATENT DOCUMENTS

| | | | |
|---|---|---|---|
| 3,816,774 A | | 6/1974 | Ohnuki et al. |
| 4,437,033 A | | 3/1984 | Diepers |
| 4,506,354 A | | 3/1985 | Hansen |
| 4,746,914 A | | 5/1988 | Adler |
| 4,825,212 A | | 4/1989 | Adler |
| 5,072,427 A | * | 12/1991 | Knowles ............... G06F 3/0436 178/18.04 |
| 5,142,511 A | | 8/1992 | Kanai et al. |
| 5,483,261 A | | 1/1996 | Yasutake |
| 5,488,204 A | | 1/1996 | Mead et al. |
| 5,591,945 A | | 1/1997 | Kent |
| 5,713,916 A | * | 2/1998 | Dias ....................... G10K 11/24 600/472 |
| 5,766,493 A | | 6/1998 | Shin |
| 5,813,998 A | * | 9/1998 | Dias ....................... G10K 11/24 601/2 |
| 5,816,225 A | | 10/1998 | Koch et al. |
| 5,825,352 A | | 10/1998 | Bisset et al. |
| 5,835,079 A | | 11/1998 | Shieh |
| 5,854,450 A | * | 12/1998 | Kent ..................... G06F 3/0418 178/18.04 |
| 5,880,411 A | | 3/1999 | Gillespie et al. |
| 6,078,315 A | * | 6/2000 | Huang .................. G06F 3/0436 178/18.04 |
| 6,091,406 A | | 7/2000 | Kambara |
| 6,188,391 B1 | | 2/2001 | Seely et al. |
| 6,225,985 B1 | | 5/2001 | Armstrong |
| 6,229,529 B1 | | 5/2001 | Yano |
| 6,310,610 B1 | | 10/2001 | Beaton et al. |
| 6,323,846 B1 | | 11/2001 | Westerman et al. |
| 6,327,011 B2 | | 12/2001 | Kim |
| 6,671,380 B2 | | 12/2003 | Chang et al. |
| 6,690,387 B2 | | 2/2004 | Zimmerman et al. |
| 6,723,929 B2 | * | 4/2004 | Kent ..................... G06F 3/0418 178/18.04 |
| 6,731,270 B2 | * | 5/2004 | Tosaya .................. B06B 1/0655 178/18.01 |
| 6,856,259 B1 | | 2/2005 | Sharp |
| 7,015,894 B2 | | 3/2006 | Morohoshi |
| 7,079,118 B2 | | 7/2006 | Benard |
| 7,098,891 B1 | | 8/2006 | Pryor |
| 7,184,064 B2 | | 2/2007 | Zimmerman et al. |
| 7,290,336 B2 | | 11/2007 | Buhler et al. |
| 7,489,308 B2 | | 2/2009 | Blake |
| 7,499,039 B2 | | 3/2009 | Roberts |
| 7,573,466 B1 | | 8/2009 | Marzen |
| 7,663,607 B2 | | 2/2010 | Hotelling et al. |
| 7,683,894 B2 | * | 3/2010 | Kent ..................... G06F 3/0418 345/177 |
| 7,907,129 B2 | | 3/2011 | Idzik |
| 8,169,404 B1 | | 5/2012 | Boillot |
| 8,325,159 B2 | * | 12/2012 | Kent ..................... G06F 3/0436 345/177 |
| 8,479,122 B2 | | 7/2013 | Hotelling et al. |
| 8,513,859 B2 | * | 8/2013 | Nikolovski ............ G01H 11/08 310/329 |
| 8,726,734 B1 | * | 5/2014 | Lin ....................... B06B 1/0622 73/626 |
| 8,743,091 B2 | | 6/2014 | Bernstein |
| 8,767,355 B2 | * | 7/2014 | Zhang .................. H01L 41/0993 360/294.4 |
| 8,854,339 B2 | * | 10/2014 | Kent ..................... G06F 3/0436 345/177 |
| 8,941,624 B2 | * | 1/2015 | Kent ..................... G06F 3/0436 345/177 |
| 9,070,862 B2 | | 6/2015 | Bibl et al. |
| 9,122,011 B2 | * | 9/2015 | Oh .............................. F21V 7/00 |
| 9,304,629 B2 | * | 4/2016 | Tanaka .................... G06F 3/043 |
| 9,342,191 B2 | * | 5/2016 | Lin ........................ G06F 3/0433 |
| 9,348,467 B2 | * | 5/2016 | Scharff .................... G06F 3/043 |
| 9,362,484 B2 | | 6/2016 | Hoisington et al. |
| 9,507,464 B2 | * | 11/2016 | Hecht .................... G06F 3/0436 |
| 2001/0012002 A1 | * | 8/2001 | Tosaya .................. B06B 1/0655 345/179 |
| 2001/0050677 A1 | * | 12/2001 | Tosaya .................. B06B 1/0655 345/179 |
| 2003/0095678 A1 | * | 5/2003 | Hooley .................... H04R 17/00 381/353 |
| 2003/0164820 A1 | * | 9/2003 | Kent ..................... G06F 3/0418 345/177 |
| 2004/0164970 A1 | | 8/2004 | Benard |
| 2005/0017959 A1 | | 1/2005 | Kraus |
| 2005/0052432 A1 | | 3/2005 | Kraus |
| 2005/0083313 A1 | | 4/2005 | Hardie-bick |
| 2005/0243071 A1 | * | 11/2005 | Kent ..................... G06F 3/0436 345/177 |
| 2005/0248548 A1 | | 11/2005 | Tsumura |
| 2006/0026521 A1 | | 2/2006 | Hotelling et al. |
| 2006/0097991 A1 | | 5/2006 | Hotelling et al. |
| 2006/0125804 A1 | * | 6/2006 | Kent ..................... G06F 3/0418 345/177 |
| 2006/0197753 A1 | | 9/2006 | Hotelling |
| 2007/0211031 A1 | | 9/2007 | Marc |
| 2007/0240913 A1 | | 10/2007 | Schermerhorn |
| 2008/0059761 A1 | | 3/2008 | Norman |
| 2008/0114251 A1 | | 5/2008 | Weymer |
| 2008/0266266 A1 | | 10/2008 | Kent |
| 2010/0026667 A1 | | 2/2010 | Bernstein |
| 2010/0117993 A1 | * | 5/2010 | Kent ..................... G06F 3/0418 345/177 |
| 2010/0171395 A1 | * | 7/2010 | Cannata ................. H01L 41/047 310/366 |
| 2011/0234545 A1 | | 9/2011 | Tanaka et al. |
| 2012/0007837 A1 | * | 1/2012 | Kent ..................... G06F 3/0436 345/177 |
| 2012/0293046 A1 | * | 11/2012 | Nikolovski ............ G01H 11/08 310/336 |
| 2013/0120322 A1 | * | 5/2013 | Tanaka .................... G06F 3/043 345/177 |
| 2013/0120323 A1 | * | 5/2013 | Scharff .................... G06F 3/043 345/177 |
| 2013/0188282 A1 | * | 7/2013 | Zhang .................. H01L 41/0993 360/234.3 |
| 2014/0267175 A1 | * | 9/2014 | Hecht .................... G06F 3/0436 345/177 |
| 2014/0375174 A1 | * | 12/2014 | Yan ........................ C04B 35/26 310/364 |
| 2015/0057540 A1 | * | 2/2015 | Sameshima ............ H01L 41/35 600/437 |
| 2016/0313793 A1 | | 10/2016 | Hong et al. |
| 2020/0042130 A1 | | 2/2020 | Pragada et al. |

FOREIGN PATENT DOCUMENTS

| | | |
|---|---|---|
| JP | 2000-163031 A | 6/2000 |
| JP | 2001-14093 A | 1/2001 |
| JP | 2002-342033 A | 11/2002 |
| WO | 2005103872 A2 | 11/2005 |
| WO | 2005/103872 A3 | 4/2006 |

OTHER PUBLICATIONS

Final Office Action dated Aug. 27, 2013, for U.S. Appl. No. 12/184,232, filed Jul. 31, 2008, 25 pages.
Non-Final Office Action dated Nov. 18, 2011, for U.S. Appl. No. 12/184,232, filed Jul. 31, 2008, 21 pages.

(56) References Cited

OTHER PUBLICATIONS

Non-Final Office Action dated Jul. 25, 2012, for U.S. Appl. No. 12/184,232, filed Jul. 31, 2008, 18 pages.
Notice of Allowance dated Mar. 14, 2014, for U.S. Appl. No. 12/184,232, filed Jul. 31, 2008, eight pages.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI '92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Non-Final Office Action received for U.S. Appl. No. 16/056,403, dated Sep. 3, 2019, 9 pages.
Notice of Allowance received for U.S. Appl. No. 16/056,403, dated Mar. 10, 2020, 8 pages.
Corrected Notice of Allowability received for U.S. Appl. No. 16/056,403, dated Jun. 23, 2020, 2 pages.
Supratik Datta, "Piezoelectric Materials: Crystal Orientation and Poling Direction", COMSOL Blog, Available Online at: <https://www.comsol.com/blogs/piezoelectric-materials-crystal-orientation-poling-direction/>, Feb. 14, 2014, 7 pages.
Huan, et al. "A Comparative Study of Three Types Shear Mode Piezoelectric Wafers in Shear Horizontal Wave Generation and Reception", Sensors 2018, Aug. 15, 2018, 12 pages.

\* cited by examiner

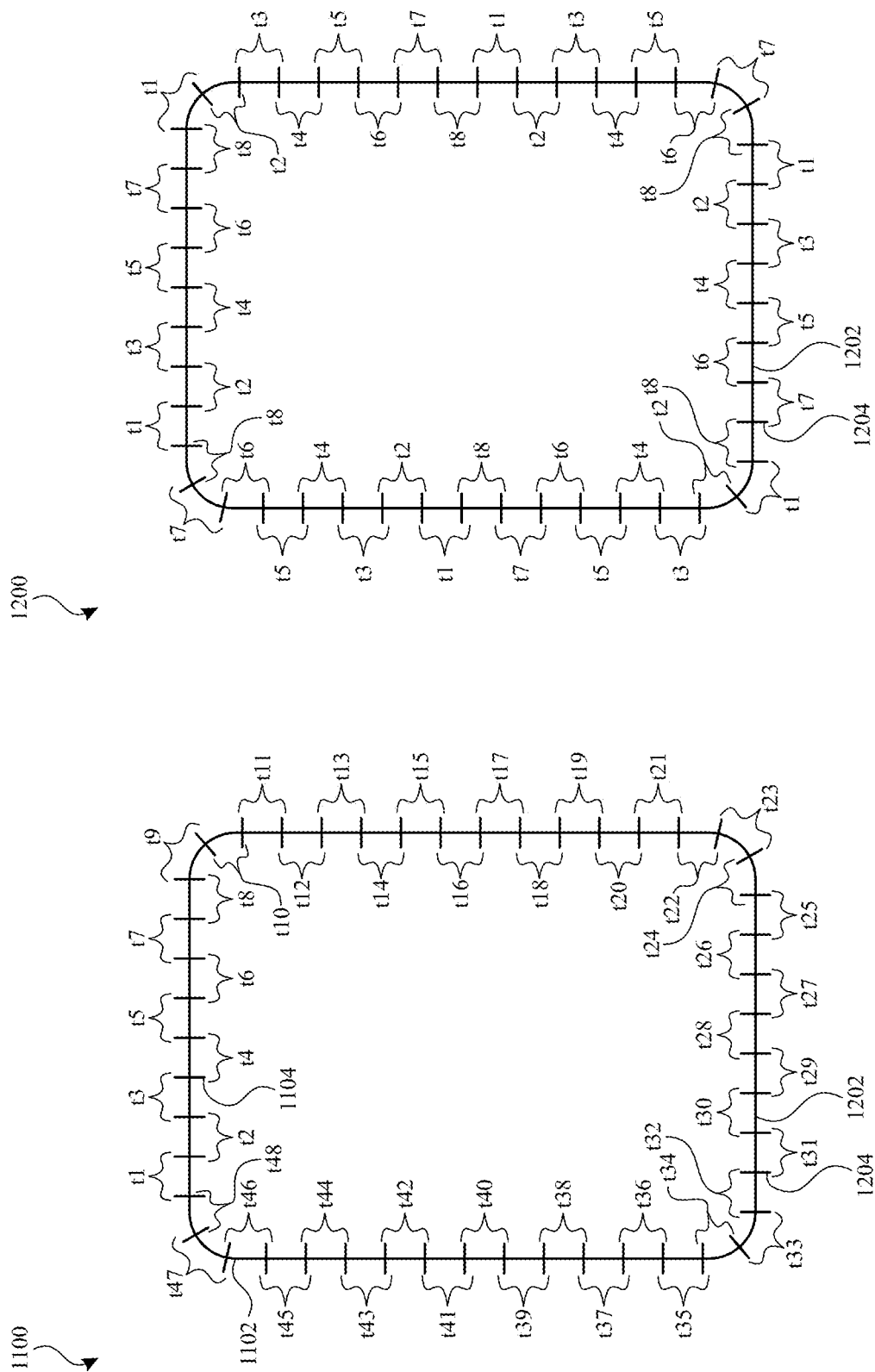

SHEAR-POLED CURVED PIEZOELECTRIC MATERIAL

CROSS REFERENCE TO RELATED APPLICATION

This application claims the benefit under 35 U.S.C. 119(e) of U.S. Provisional Patent Application No. 62/563,617, filed Sep. 26, 2017 the contents of which are incorporated herein by reference in their entirety for all purposes.

FIELD OF THE DISCLOSURE

This relates generally to piezoelectric materials, and more particularly, to shear-poled curved piezoelectric materials and methods for shear poling curved piezoelectric materials.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface. Capacitive-type touch sensing systems, however, can experience reduced performance due to conductive, electrically-floating objects (e.g., water droplets) in contact with the touch-sensitive surface.

SUMMARY

This relates to piezoelectric materials including one or more curved (non-linear) segments that can be used for acoustic transducers. The piezoelectric material can be shear poled such that a poling direction of the piezoelectric material can follow the curvature of the piezoelectric material. The piezoelectric material can also have a unidirectional poling direction. In some examples, the piezoelectric material can be a closed ring with a circular or partially circular shape. This also relates to methods of shear poling a piezoelectric material with curves by shear poling segments of the piezoelectric material with one or more sets of poling electrodes. The poling electrodes of a respective one of the one or more sets of poling electrodes can be coupled to the same side of the piezoelectric material.

BRIEF DESCRIPTION OF THE DRAWINGS

FIGS. 11-15 illustrate exemplary configurations for shear poling a piezoelectric material with one or more curves according to examples of the disclosure.

DETAILED DESCRIPTION

In the following description of various examples, reference is made to the accompanying drawings which form a part hereof, and in which it is shown by way of illustration specific examples that can be practiced. It is to be understood that other examples can be used and structural changes can be made without departing from the scope of the various examples.

This relates to piezoelectric materials including one or more curved (non-linear) segments that can be used for acoustic transducers. The piezoelectric material can be shear poled such that a poling direction of the piezoelectric material can follow the curvature of the piezoelectric material. The piezoelectric material can also have a unidirectional poling direction. In some examples, the piezoelectric material can be a closed ring with a circular or partially circular shape. This also relates to methods of shear poling a piezoelectric material with curves by shear poling segments of the piezoelectric material with one or more sets of poling electrodes. The poling electrodes of a respective one of the one or more sets of poling electrodes can be coupled to the same side (rather than opposite sides) of the piezoelectric material.

Figure 1A:
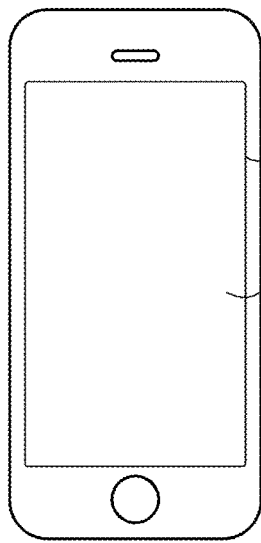
FIGS. 1A-1E illustrate exemplary systems with touch screens that can include acoustic sensors for detecting contact between an object and a surface of the system according to examples of the disclosure.
Figure 1B:
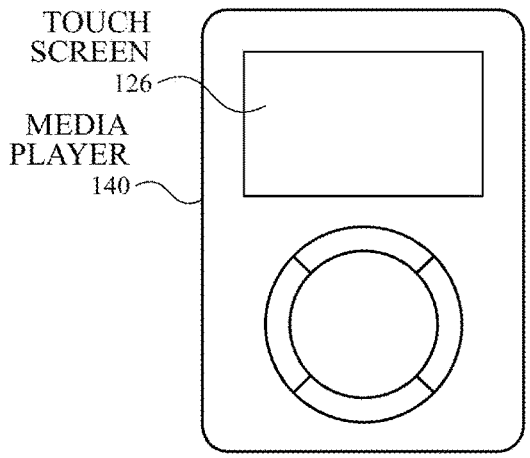
Figure 1C:
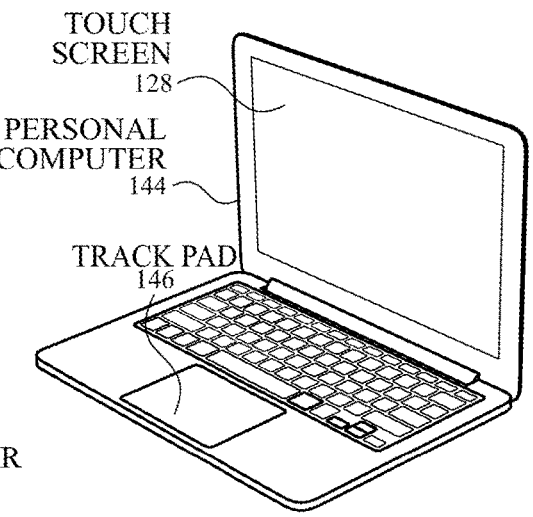
Figure 1D:
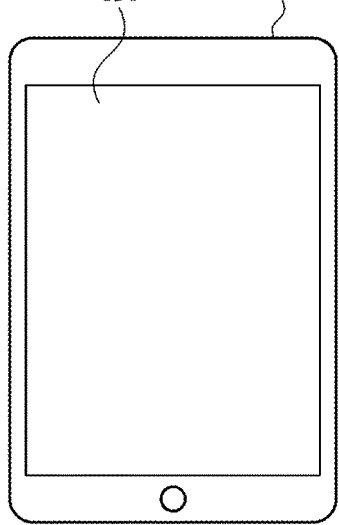
Figure 1E:
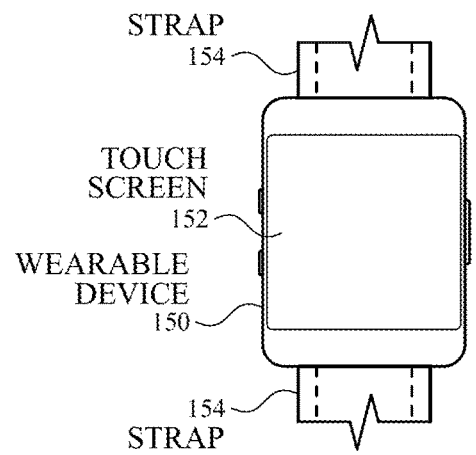

FIGS. 1A-1E illustrate exemplary systems with touch screens that can include acoustic sensors for detecting contact between an object (e.g., a finger or stylus) and a surface of the system according to examples of the disclosure. As described in more detail herein, the acoustic sensors can include one or more transducers formed from piezoelectric material with curves. FIG. 1A illustrates an exemplary mobile telephone 136 that includes a touch screen 124 and can include an acoustic touch sensing system according to examples of the disclosure. FIG. 1B illustrates an example digital media player 140 that includes a touch screen 126 and can include an acoustic touch sensing system according to examples of the disclosure. FIG. 1C illustrates an example personal computer 144 that includes a touch screen 128 and a track pad 146, and can include an acoustic touch sensing system according to examples of the disclosure. FIG. 1D illustrates an example tablet computing device 148 that includes a touch screen 130 and can include an acoustic touch sensing system according to examples of the disclosure. FIG. 1E illustrates an example wearable device 150 (e.g., a watch) that includes a touch screen 152 and can include an acoustic touch sensing system according to examples of the disclosure. Wearable device 150 can be coupled to a user via strap 154 or any other suitable fastener. It should be understood that the example devices illustrated in FIGS. 1A-1E are provided by way of example, and other types of devices can include an acoustic touch sensing system for detecting contact between an object and a surface of the device. Additionally, although the devices illustrated in FIGS. 1A-1E include touch screens, in some examples, the devices may have a non-touch-sensitive display.

Acoustic sensors can be incorporated in the above described systems to add acoustic touch sensing capabilities to a surface of the system. For example, in some examples, a touch screen (e.g., capacitive, resistive, etc.) can be augmented with acoustic sensors to provide a touch sensing capability for use in wet environments or under conditions where the device may get wet (e.g., exercise, swimming, rain, washing hands). In some examples, an otherwise non-touch sensitive display screen can be augmented with acoustic sensors to provide a touch sensing capability. In such examples, a touch screen can be implemented without the stack-up required for a capacitive touch screen. In some examples, the acoustic sensors can be used to provide touch sensing capability for a non-display surface. For example, the acoustic sensors can be used to provide touch sensing capabilities for a track pad 146, a button, a scroll wheel, part or all of the housing or any other surfaces of the device (e.g., on the front, rear or sides).

Figure 2:
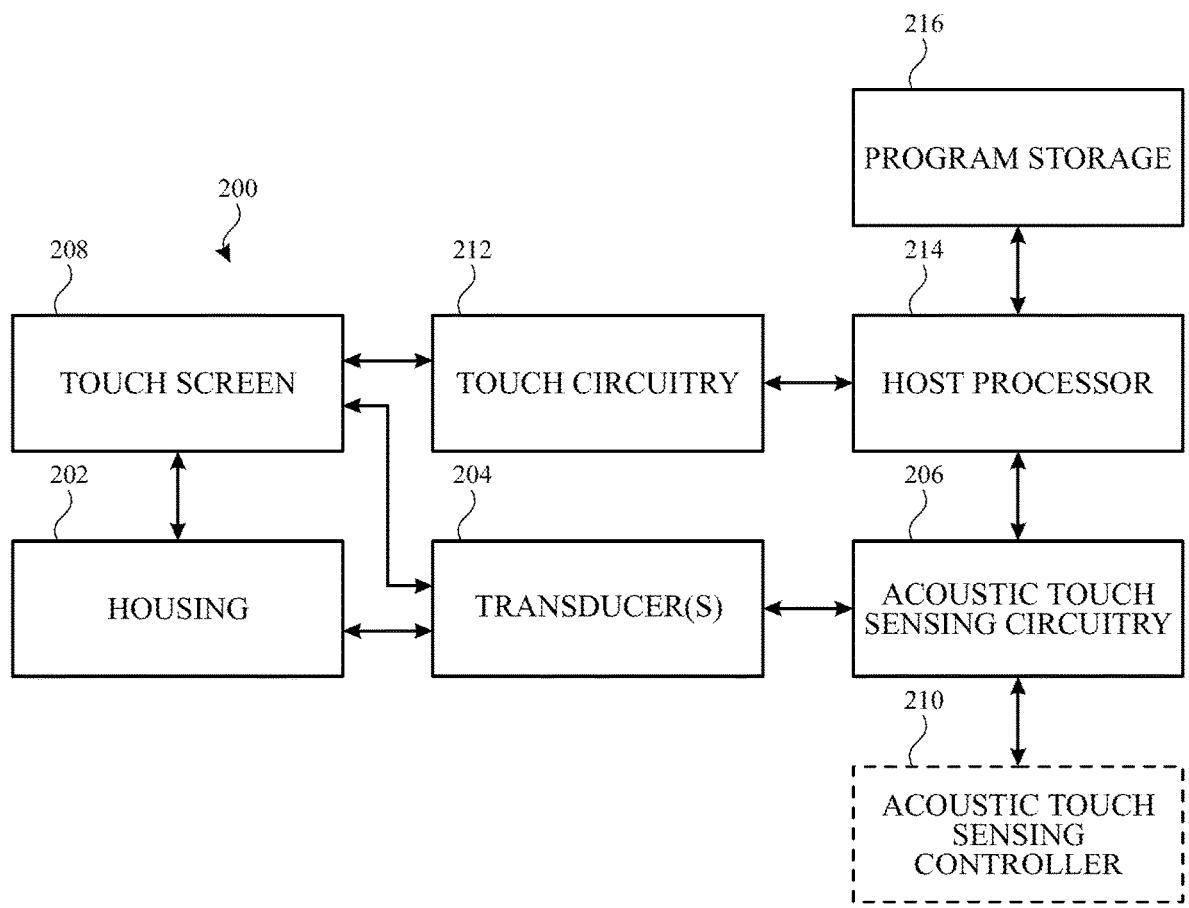
FIG. 2 illustrates an exemplary block diagram of an electronic device including an acoustic touch sensing system according to examples of the disclosure.

FIG. 2 illustrates an exemplary block diagram of an electronic device including an acoustic touch sensing system according to examples of the disclosure. In some examples, housing 202 of device 200 (which can correspond to mobile telephone 136, digital media player 140, personal computer 144, tablet computer 148, and wearable device 150 above) can be coupled (e.g., mechanically) with one or more acoustic transducers 204. In some examples, transducers 204 can be piezoelectric transducers, which can be made to vibrate by the application of electrical signals when acting as a transmitter, and generate electrical signals based on detected vibrations when acting as a receiver. In some examples, transducers 204 can be formed from a piezoelectric ceramic material (e.g., lead zirconate titanate (PZT) or niobate perovskite compounds (KNN)) or a piezoelectric plastic material (e.g., PVDF). Similarly, transducers 204 can produce electrical energy as an output when vibrated. In some examples, transducers 204 can be bonded to housing 202 by a bonding agent (e.g., a thin layer of stiff epoxy). In some examples, transducers 204 can be deposited on the surface through processes such as deposition, lithography, or the like. In some examples, transducers 204 can be bonded to the surface using conductive or non-conductive bonding materials. When electrical energy is applied to transducers 204 it can cause the transducers to vibrate, the surface material in contact with the transducers can also be caused to vibrate, and the vibrations of the molecules of the surface material can propagate as an acoustic wave through the surface material. In some examples, vibration of traducers 204 can be used to produce ultrasonic acoustic waves at a selected frequency over a broad frequency range (e.g., 500 kHz-10 MHz) in the medium of the surface of the electronic device which can be metal, plastic, glass, wood, or the like. It should be understood that other frequencies outside of the exemplary range above can be used while remaining within the scope of the present disclosure.

In some examples, transducers 204 can also be partially or completely disposed on (or coupled to) a portion of a touch screen 208. For example, touch screen 208 (e.g., capacitive) may include a glass panel (cover glass) or a plastic cover, and a display region of the touch screen may be surrounded by a non-display region (e.g., a black border region surrounding the periphery of the display region of touch screen). In some examples, transducers 204 can be disposed partially or completely in the black mask region of touch screen 208 glass panel (e.g., on the back side of the glass panel behind the black mask) such that the transducers are not visible (or are only partially visible) to a user. Some exemplary integrations of transducers and cover glass (and acoustic touch detection circuits) are described in U.S. patent application Ser. No. 15/663,588 filed Jul. 28, 2017 (Brian KING et al.), the disclosure of which is herein incorporated by reference in its entirety for all intended purposes.

Device 200 can further include acoustic touch sensing circuitry 206, which can include circuitry for driving electrical signals to stimulate vibration of transducers 204 (e.g., transmit circuitry), as well as circuitry for sensing electrical signals output by transducers 204 when the transducer is stimulated by received acoustic energy (e.g., receive circuitry). In some examples, timing operations for acoustic touch sensing circuitry 206 can optionally be provided by a separate acoustic touch sensing controller 210 that can control timing of operations by acoustic touch sensing circuitry 206. In some examples, touch sensing controller 210 can be coupled between acoustic touch sensing circuitry 206 and host processor 214. In some examples, controller functions can be integrated with acoustic touch sensing circuitry 206 (e.g., on a single integrated circuit). Output data from acoustic touch sensing circuitry 206 can be output to a host processor 214 for further processing to determine a location of an object contacting the device as will be described in more detail below. In some examples, the processing for determining location of a contacting object can be performed by acoustic touch sensing circuitry 206, acoustic touch sensing controller 210 or a separate sub-processor of device 200 (not shown).

In addition to acoustic touch sensing, device 200 can include additional touch circuitry 212 and optionally a touch controller (not shown) that can be coupled to the touch screen 208. In examples including a touch controller, the touch controller can be disposed between touch circuitry 212 and host processor 214. Touch circuitry 212 can, for example, be capacitive or resistive touch sensing circuitry, and can be used to detect contact and/or hovering of objects (e.g., fingers, styli) in contact with and/or in proximity to touch screen 208, particularly in the display region of the touch screen. Thus, device 200 can include multiple types of sensing circuitry (e.g., touch circuitry 212 and acoustic touch sensing circuitry 206) for detecting objects (and their positions) in different regions of the device and/or for different purposes, as will be described in more detail below. Although described herein as including a touch screen, it should be understood that touch circuitry 212 can be omitted, and in some examples, touch screen 208 can be replaced by an otherwise non-touch-sensitive display (e.g., but-for the acoustic sensors).

Host processor 214 can receive acoustic or other touch outputs (e.g., capacitive) and perform actions based on the touch outputs. Host processor 214 can also be connected to program storage 216 and touch screen 208. Host processor 214 can, for example, communicate with touch screen 208 to generate an image on touch screen 208, such as an image of a user interface (UI), and can use touch circuitry 212 and/or acoustic touch sensing circuitry 206 (and, in some examples, their respective controllers) to detect a touch on or near touch screen 208, such as a touch input to the displayed UI. The touch input can be used by computer programs stored in program storage 216 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 214 can also perform additional functions that may not be related to touch processing.

Note that one or more of the functions described herein can be performed by firmware stored in memory and executed by touch circuitry 212 and/or acoustic touch sensing circuitry 206 (or their respective controllers), or stored in program storage 216 and executed by host processor 214. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding a signal) that can contain or store the program for use by or in connection with the instruction execution system, apparatus, or device. The non-transitory computer readable medium storage can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, Universal Serial Bus (USB) memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

It is to be understood that device 200 is not limited to the components and configuration of FIG. 2, but can include other or additional components in multiple configurations according to various examples. Additionally, the components of device 200 can be included within a single device, or can be distributed between multiple devices. Additionally, it should be understood that the connections between the components is exemplary and different unidirectional or bidirectional connections can be included between the components depending on the implementation, irrespective of the arrows shown in the configuration of FIG. 2.

Figure 3A:
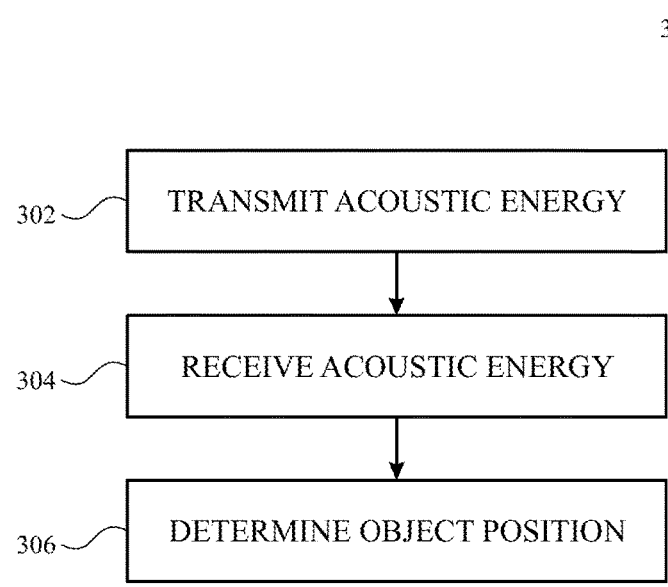
FIG. 3A illustrates an exemplary process for acoustic touch sensing of an object contact position according to examples of the disclosure.

FIG. 3A illustrates an exemplary process 300 for acoustic touch sensing of an object contact position according to examples of the disclosure. At 302, acoustic energy can be transmitted (e.g., by one or more transducers 204) along a surface and/or through the thickness of a device in the form of an ultrasonic wave, for example. In some examples, the wave can propagate as a compressive wave, a guided wave such as a shear horizontal wave, a Rayleigh wave, a Lamb wave, a Love wave, a Stonely wave, or a surface acoustic wave. Other propagation modes for the transmitted acoustic energy can also exist based on the properties of the surface material, geometry and the manner of energy transmission from the transducers to the surface of the device. In some examples, the surface can be formed from glass, plastic, or sapphire crystal (e.g., touch screen 208) or the surface can formed from metal, ceramics, plastic, or wood (e.g., housing 202). Transmitted energy can propagate along the surface and/or through the thickness until a discontinuity in the surface is reached (e.g., an object, such as a finger, in contact with the surface), which can cause a portion of the energy to reflect. In some examples, a discontinuity can occur at edges of the surface material (e.g., when the ultrasonic wave propagates to the edge of the surface opposite the transducer). When the transmitted energy reaches one of the discontinuities described above, some of the energy can be reflected, and a portion of the reflected energy can be directed to one or more transducers (e.g., transducers 204). In some examples, water or other fluids in contact with the surface of the device (e.g., device 200) will not act as a discontinuity to the acoustic waves, and thus the acoustic touch sensing process can be effective for detecting the presence of an object (e.g., a user's finger) even in the presence of water drops (or other low-viscosity fluids) on the surface of the device or even while the device is fully submerged.

At 304, returning acoustic energy can be received, and the acoustic energy can be converted to an electrical signal by one or more transducers (e.g., transducers 204).

At 306, the acoustic sensing system can determine whether one or more objects is contacting the surface of the device, and can further detect the position of one or more objects based on the received acoustic energy. In some examples, a distance of the object from the transmission source (e.g., transducers 204) can be determined from a time-of-flight between transmission and reception of reflected energy, and a propagation rate of the ultrasonic wave through the material. In some examples, baseline reflected energy from one or more intentionally included discontinuities (e.g., edges) can be compared to a measured value of reflected energy corresponding to the one or more discontinuities. The baseline reflected energy can be determined during a measurement when no object (e.g., finger) is in contact with the surface. Deviations of the reflected energy from the baseline can be correlated with a presence of an object touching the surface. Although process 300, as described above, generally refers to reflected waves received by the transducers that transmitted the waves, in some examples, the transmitter and receiver functions can be separated such that the transmission of acoustic energy at 302 and receiving acoustic energy at 304 may not occur at the same transducer. Exemplary device configurations and measurement timing examples that can be used to implement process 300 will be described in further detail below.

Figure 3B:
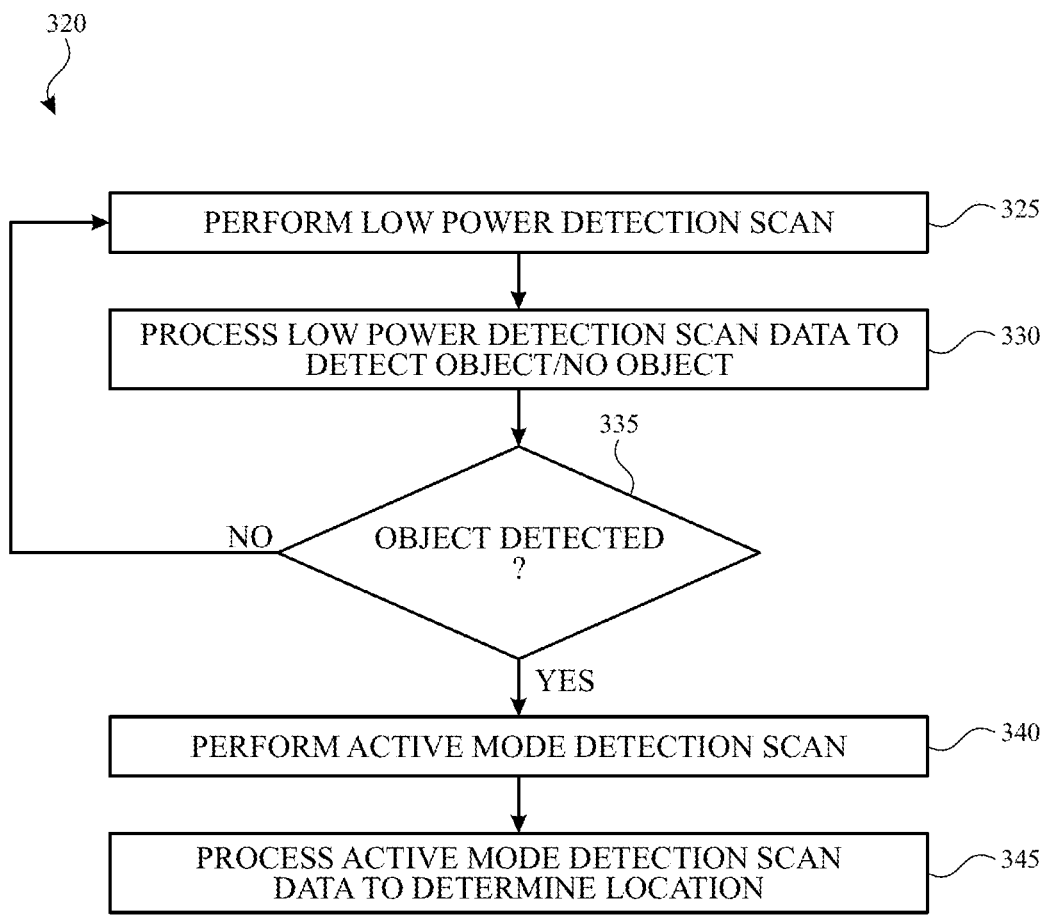
FIG. 3B illustrates an exemplary process for acoustic touch sensing of an object presence and contact position in various modes according to examples of the disclosure.

In some examples, the acoustic touch sensing can be performed differently in different operating modes. For example, the acoustic touch sensing can include a low power mode (e.g., when objects are not detected, when display is turned off) and an active mode (e.g., when an object is detected). FIG. 3B illustrates an exemplary process 320 for acoustic touch sensing of an object presence and contact position in various modes (e.g., a low power mode and an active mode) according to examples of the disclosure. At 325, the acoustic touch sensing system can perform a low power detection scan. In some examples, the low power detection scan can include sensing with fewer (in comparison to the active mode scan) of the transducers of the acoustic touch sensing system (e.g., four transducers may be used for the active mode detection scan as described below with respect to FIG. 5A, and fewer than four transducers may be used for the low power detection scan). In some examples, the acoustic touch sensing system can use a single transducer to transmit acoustic waves and receive reflections to determine the presence of an object touching. Additionally or alternatively, in some examples, the low power detection scan can include sensing energy or waves received by one or more transducers for a shorter (in comparison to the active mode scan) period of time. For example, the low power scan can sense the energy or waves for the period of time corresponding to a reflection of an opposite edge of the touch sensing surface (rather than for a period that may include other reflections). Attenuation in the reflected energy or wave corresponding to the opposite edge compared with a no-touch baseline of reflected energy or wave corresponding to the opposite edge can be an indication that an object is touching the surface. Additionally or alternatively, low power detection scan can be performed at a reduced frame rate (e.g., 10-30 Hz for the low power detection scans rather than 30-120 Hz for active mode detection scans), thereby reducing the power consumption by the various analog-to-digital converter (ADC) and digital-to-analog (DAC) components. At 330, the acoustic touch sensing system can process data from the low power detection scan and detect whether an object is or is not touching the surface. When no object is detected on the surface at 335, the acoustic touch sensing system can remain in a low power mode, and continue to perform low power detection scans (in the same or in subsequent scan frames). When an object is detected on the surface at 335, the acoustic touch sensing system can transition into an active mode and, at 340, perform an active mode detection scan. At 345, the data from the active mode detection scan can be processed to determine a location (e.g., centroid) of the object(s) contacting the surface (e.g., as described below with reference to FIG. 5A).

Although process 300 is described as a low power detection scan and an active mode detection scan, it should be understood that process 300 can generally provide a coarse detection scan (e.g., indicating the presence or absence of a touch) and a fine detection scan (e.g., indicating the location of the touch) without limiting the system to low power mode and/or active mode operation.

Figure 4:
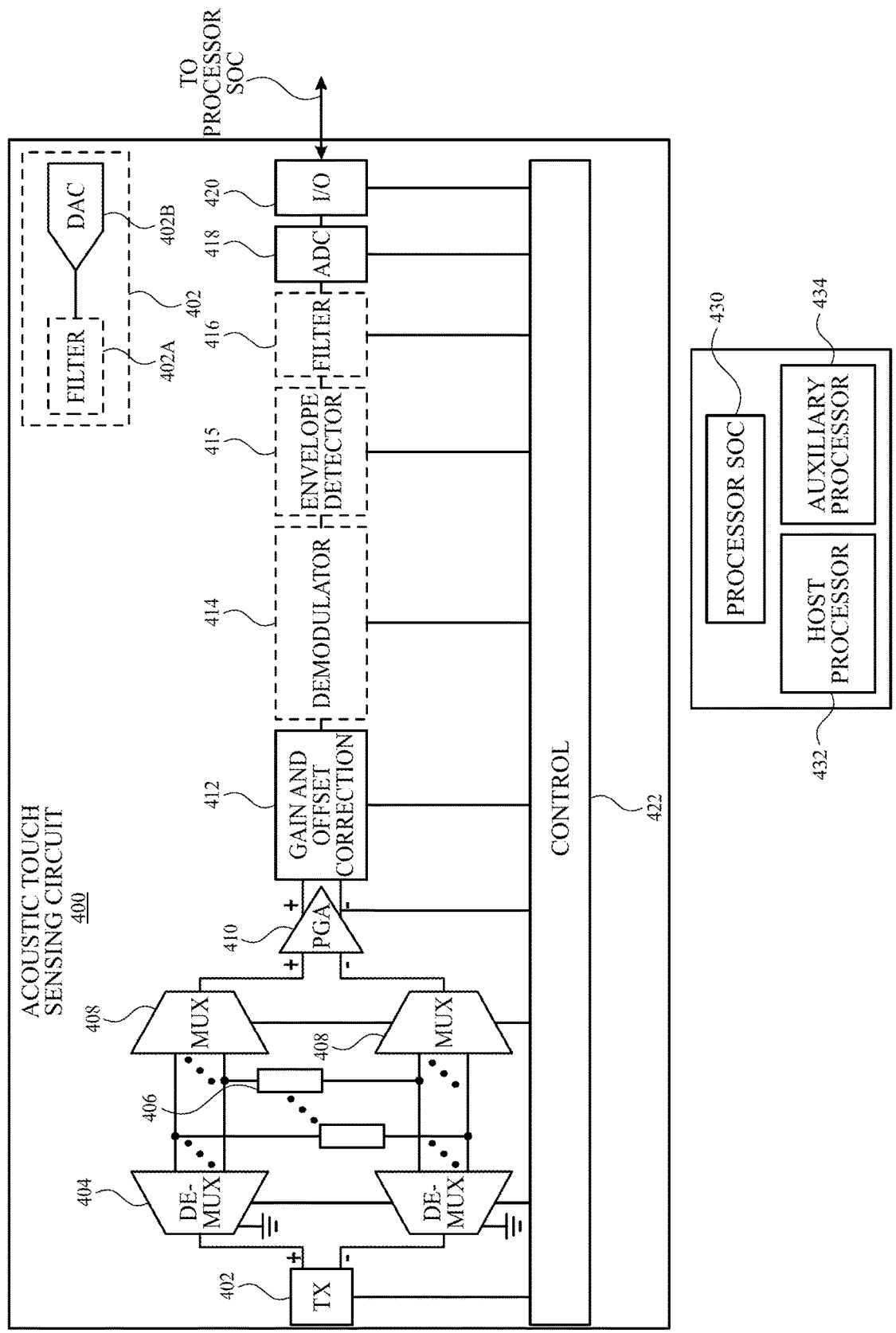
FIG. 4 illustrates an exemplary configuration of an acoustic touch sensing circuit according to examples of the disclosure.

FIG. 4 illustrates an exemplary configuration of an acoustic touch sensing circuit 400 according to examples of the disclosure. Acoustic touch sensing circuit 400 can include acoustic touch sensing circuitry 402-404 and 408-420 (which can correspond to acoustic touch sensing circuitry 206 above) and control circuit 422 (which can correspond to acoustic touch sensing controller 210 above). In some examples, acoustic touch sensing circuit 400 can also optionally include transducers 406 (which can correspond to transducers 204 above). In some examples, a transmitter 402 can generate an electrical signal for stimulating movement of one or more of a plurality of transducers 406. In some examples, the transmitted signal can be a differential signal, and in some examples, the transmitted signal can be a single-ended signal. In some examples, transmitter 402 can be a simple buffer, and the transmitted signal can be a pulse (or burst of pulses at a particular frequency). In some examples, transmitter 402 can include a digital-to-analog converter (DAC) 402A and optionally a filter 402B that can be used to smooth a quantized output of DAC 402A. In some examples, characteristics of the transducer itself can provide a filtering property and filter 402B can be omitted. DAC 402A can be used to generate an arbitrary transmit waveform. In some examples, the arbitrary waveform can pre-distort the transmit signal to equalize the channel. In some examples, the characteristics of each channel, such as the properties of the surface material coupled to transducers 406, the discontinuities in the surface material, and the reflection characteristics of an edge of the device can be measured and stored. In some examples, the channel characteristics can be measured as a manufacturing step (or factory calibration step), and in other examples the characteristics can be measured as a periodic calibration step (i.e., once a month, once a year, etc. depending on how quickly the channel characteristics are expected to change). In some examples, the channel characteristics can be converted to a transfer function of the channel, and the arbitrary transmit waveform can be configured using the inverse of the channel transfer function such that the returning signal is equalized (e.g., returning signal can be detected as a pulse or a burst of pulses despite the transmitted waveform having a seemingly arbitrary waveform). In some examples, a single differential pulse can be used as a transmit waveform. For example, a bipolar square pulse (where the voltage applied to the transducer can be both positive and negative) can be used as the transmit waveform, and the bipolar square pulse can be implemented using a single-ended or differential implementation.

Although not shown in FIG. 4, in some examples acoustic touch sensing circuit 400 can receive or generate a high voltage supply to enable high voltage stimulation of transducers. In some examples, the high voltage can be generated externally and supplied to acoustic touch sensing circuit 400. In some examples, acoustic touch sensing circuit 400 can include a voltage boosting circuit (e.g., a charge pump) to generate high voltages in acoustic touch sensing circuit 400.

A pair of demultiplexers 404 (e.g., in a differential implementation) can be used to selectively couple transmitter 402 to one of transducers 406 that can be the active transducer for a particular measurement step in a measurement cycle. In some examples, demultiplexers 404 can have a ground connection, and the non-selected demultiplexer outputs can be shorted, open, or grounded. As described above, transducers 406 can also generate output electrical signals when motion is induced in the transducers by acoustic energy. A pair of multiplexers 408 (e.g., in a differential implementation) can be used to select a transducer 406 for coupling to a programmable gain amplifier 410 configured to amplify the received signals. In some examples, the same transducer 406 can be coupled to transmitter 402 by demultiplexers 404 during the drive mode and coupled to programmable gain amplifier 410 by multiplexers 408 during the receive mode. Thus, a single transducer 406 can be used both for transmitting and receiving acoustic energy. In some examples, a first transducer can be coupled to transmitter 402 by demultiplexers 404 and a second transducer can be coupled by multiplexers 408 to programmable gain amplifier 410. For example, the transmitting transducer and the receiving transducer can be discrete piezoelectric elements, where the transmitting transducer can be designed for being driven by higher voltages (or currents) to produce sufficient motion in transducer 406 to generate an acoustic wave in the surface of a device (e.g., device 200 above), and the receiving transducer can be designed for receiving smaller amplitude reflected energy. In such an architecture, the transmit side circuitry (e.g., 402 and 404) can be optionally implemented on a high voltage circuit, and the receive side circuitry (e.g., 408-420) can be optionally implemented on a separate low voltage circuit. In some examples, multiplexers 408 can also be implemented on the high voltage circuit to properly isolate the remaining receive side circuitry (e.g., 410-420) during transmission operations by transmit side circuitry. Additionally or alternatively, in some examples, the transmit circuit can include an energy recovery architecture that can be used to recover some of the energy required for charging and discharging the transducer. In some examples, the programmable gain amplifier output can be coupled to gain and offset correction circuit 412. It should be understood that for a single-ended implementation, a single demultiplexer 404 and a single multiplexer 408 can be used, and transmitter 402, programmable gain amplifier 410, and the input to gain and offset correction circuit 412 can be single-ended as well. Differential implementations, however, can provide improved noise suppression over a single-ended implementation.

In some examples, the acoustic touch sensing circuit can be used in a system include multiple transmit transducers and one receive transducer. In such examples, demultiplexer 404 can be unnecessary and omitted from the acoustic touch sensing circuit. In some examples, the acoustic touch sensing circuit can be used in a system including multiple receive transducers and one transmit transducer. In such examples, multiplexer 408 can be unnecessary and omitted from the acoustic touch sensing circuit.

In some examples, the output of gain and offset correction circuit 412 can optionally be coupled to one or more analog processing circuits. In some examples, the output of gain and offset correction circuit 412 can be coupled to a demodulation circuit 414 configured to demodulate the received signals (e.g., by I/Q demodulation). In some examples, the output of the gain and offset correction circuit 412 can be coupled to an envelope detection circuit 415 configured to perform envelope detection on the received signals. In some examples, the output of gain and offset correction circuit 412 can be filtered at filter 416. In some examples, these blocks can be placed in a different order. In some examples, the processing of these analog processing circuits can be performed in the digital domain.

The received signals, whether raw or processed by one or more of demodulation circuit 414, envelope detection circuit 415 or filter 416 can be passed to an analog-to-digital converter (ADC) 418 for conversion to a digital signal. In some examples, an input/output (I/O) circuit 420 can be used to transmit received data for processing. In some examples, the output of I/O circuit 420 can be transferred to a host processor of the device, or to an auxiliary processor (sub-processor) separate from the host processor. For example, as illustrated, the output of I/O circuit 420 can be coupled to a processor system-on-chip (SoC) 430, which can include one or more processors. In some examples, processor SoC 430 can include a host processor 432 (e.g., an active mode processor) and an auxiliary processor 434 (e.g., a low power processor). In some examples, some or all of the digital signal processing can be performed (e.g., by acoustic touch sensing circuit 400) before transmitting the data to one or more other processors in the system (e.g., processor SoC 430). A control circuit 422 (e.g., a programmable logic circuit) can be used to control timing and operations of the acoustic touch sensing circuitry 402-420. In some examples, the I/O circuit is not only used for data transfer to processor SoC 430 (e.g., host processor 432), but also is used for writing the control registers and/or firmware download from processor SoC 430.

Processing data from acoustic touch detection scans can be performed by different processing circuits of an acoustic touch sensing system. For example, auxiliary processor 434 can be a low power processor that can remain active even when host processor 432 may be idle and/or powered down. In some examples, auxiliary processor 434 can received acoustic touch data in a low-power mode (e.g., from performing a low-power scan), and process the acoustic touch data to determine the presence or absence of an object touching the sensing surface. Once an object is detected touching the sensing surface, the system can transition from the low-power mode to an active mode, and acoustic touch data (e.g., from performing active mode scans) can be processed by auxiliary processor 434 to determine the location of the object. Host processor 432 can receive the location of the object touching the surface from auxiliary processor 434 and perform an action based thereon. In some examples, acoustic touch sensing circuit 400 can perform some processing (e.g., averaging, data compression, etc.) before sending acoustic touch data to auxiliary processor 434 (and/or host processor 432). In some examples, the auxiliary processor can process acoustic touch data from a low-power scan and the host processor can process acoustic touch data from active mode scans. In some examples, the host processor can process acoustic touch data from both low-power scans and active mode scans. In some examples, acoustic touch sensing circuit 400 can include a dedicated acoustic touch digital signal processor (DSP) to process acoustic touch data from low-power scans and/or active mode scans. The results of the processing by the DSP can be sent to processor SoC 430.

It is to be understood that the configuration of FIG. 4 is not limited to the components and configuration of FIG. 4, but can include other or additional components in multiple configurations according to various examples. Additionally, some or all of the components 402-404 and 408-420 can be included in a single circuit, or can be divided among multiple circuits while remaining within the scope of the examples of the disclosure.

Figure 5A:
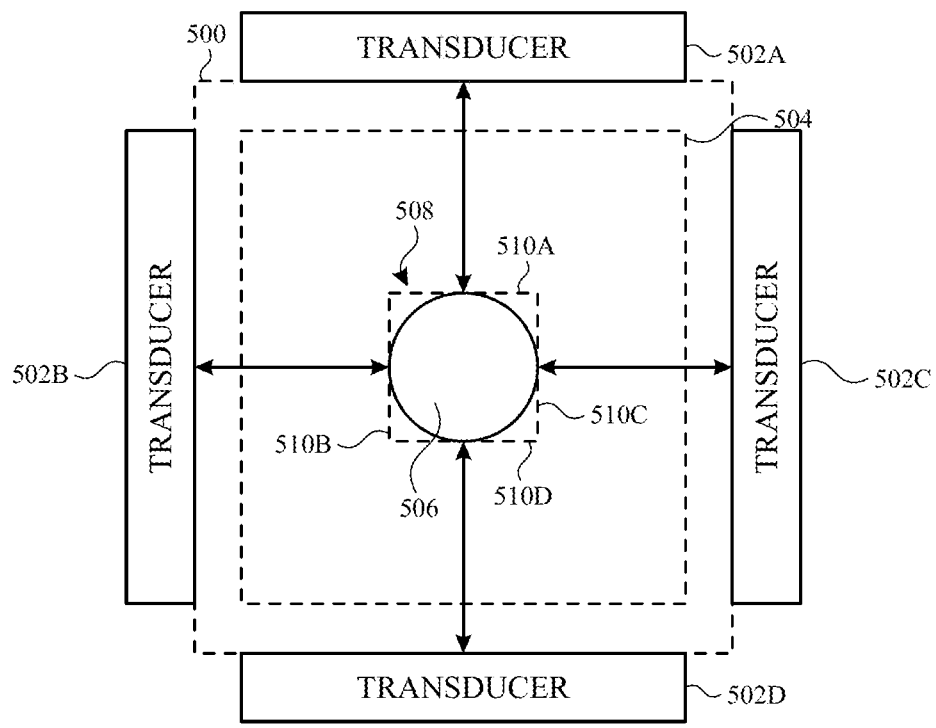
FIGS. 5A-5F illustrate exemplary system configurations and timing diagrams for acoustic touch sensing to determine position using a bounding box technique according to examples of the disclosure.

As described herein, various acoustic sensing techniques can be used to determine position of an object in touching a surface. In some examples, one or more time-of-flight (TOF) measurements can be performed using one or more acoustic transducers to determine boundaries of the position that the object is touching. FIGS. 5A-5F illustrate exemplary system configurations and timing diagrams for acoustic touch sensing to determine position using a bounding box technique according to examples of the disclosure. FIG. 5A illustrates an exemplary acoustic touch sensing system configuration using four acoustic transducers 502A-D mounted along (or otherwise coupled to) four edges of a surface 500 (e.g., cover glass). Transducers 502A-D can be configured to generate acoustic waves (e.g., shear horizontal waves) and to receive the reflected acoustic waves. Propagation of shear horizontal waves can be unaffected by water on surface 500 because low viscosity fluids and gases (such as water and air) have a very low shear modulus, and therefore do not perturb the boundary conditions that affect wave propagation. Shear horizontal waves can be highly directional waves such that the active detection region (or active area) 504 can be effectively defined based on the position and dimensions of the acoustic transducers 502A-D. It should be understood, however, that active area can change based on the directionality property of the acoustic waves and the size and placement of acoustic transducers 502A-D. Additionally, it should be understood that although illustrated as transmit and receive transducers, in some examples, the transmit and receive functions can be divided (e.g., between two transducers in proximity to one another, rather than one transmit and receive transducer transducer).

The position of a touch 506 from an object in contact with surface 500 can be determined by calculating TOF measurements in a measurement cycle using each of acoustic transducers 502A-D. For example, in a first measurement step of the measurement cycle, acoustic transducer 502A can transmit an acoustic wave and receive reflections from the acoustic wave. When no object is present, the received reflection will be the reflection from the acoustic wave reaching the opposite edge of surface 500. However, when an object is touching surface 500 (e.g., corresponding to touch 506), a reflection corresponding to the object can be received before receiving the reflection from the opposite edge. Based on the received reflection corresponding to the object received at transducer 502A, the system can determine a distance to the edge (e.g., leading edge) of touch 506, marked by boundary line 510A. Similar measurements can be performed by transducers 502B, 502C and 502D to determine a distance to the remaining edges of touch 506, indicated by boundary lines 510B, 510C and 510D. Taken together, the measured distances as represented by boundary lines 510A-510D can form a bounding box 508. In some examples, based on the bounding box, the acoustic touch sensing system can determine the area of the touch (e.g., the area of the bounding box). Based on the bounding box, the acoustic touch sensing system can determine position of touch 506 (e.g., based on a centroid and/or area of the bounding box).

The acoustic touch sensing scan described with reference to FIG. 5A can correspond to the active mode detection scan, described above with reference to FIG. 3B, that can be used to determine the position/location of an object touching the surface.

Figure 5B:
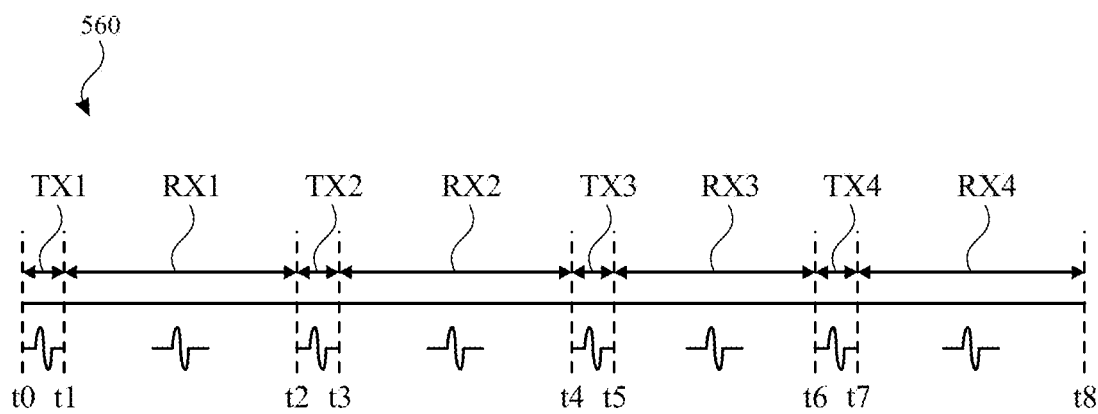

FIG. 5B illustrates an exemplary timing diagram 560 for an acoustic touch sensing scan described in FIG. 5A according to examples of the disclosure. As illustrated in FIG. 5B, each of the transducers can transmit acoustic waves and then receive reflected waves in a series of measurement steps. For example, from t0 to t1 a first transducer (e.g., acoustic transducer 502A) can be stimulated, and reflections at the first transducer can be received from t1 to t2. From t2 to t3 a second transducer (e.g., acoustic transducer 502B) can be stimulated, and reflections at the second transducer can be received from t3 to t4. From t4 to t5 a third transducer (e.g., acoustic transducer 502C) can be stimulated, and reflections at the third transducer can be received from t5 to t6. From t6 to t7 a fourth transducer (e.g., acoustic transducer 502D) can be stimulated, and reflections at the fourth transducer can be received from t7 to t8. Although the transmit (Tx) and receive (Rx) functions are shown back-to-back in FIG. 5B for each transducer, in some examples, gaps can be included between Tx and Rx functions for a transducer (e.g., to minimize capturing portions of the transmitted wave at the receiver), and or between the Tx/Rx functions of two different transducers (such that acoustic energy and the transients caused by multiple reflections from a scan by one transducer does not impact a scan by a second transducer). In some examples, unused transducers can be grounded (e.g., by multiplexers/demultiplexers).

Figure 5C:
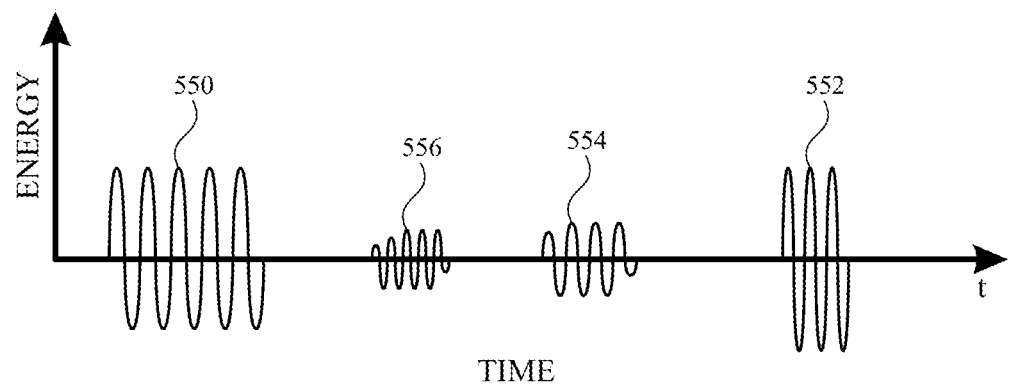

The distance between an object touching the surface and a transducer can be calculated based on TOF principles. The acoustic energy received by transducers can be used to determine a timing parameter indicative of a leading edge of a touch. The propagation rate of the acoustic wave through the material forming the surface can be a known relationship between distance and time. Taken together, the known relationship between distance and time and the timing parameter can be used to determine distance. FIG. 5C illustrates an exemplary timing diagram according to examples of the disclosure. FIG. 5C illustrates the transducer energy output versus time. Signal 550 can correspond to the acoustic energy at the transducer from the generation of the acoustic wave at a first edge of the surface. Signal 552 can correspond to the acoustic energy at the transducer received from the wave reflected off of a second edge opposite the first edge of the surface. Due to the known distance across the surface from the first edge to the opposite second edge and the known or measured propagation rate of the acoustic signal, the reflection off of the opposite edge of the surface occurs at a known time. Additionally, one or more objects (e.g., fingers) touching the surface can cause reflections of energy in the time between the generation of the wave and the edge reflection (i.e., between signals 550 and 552). For example, signals 556 and 554 can correspond to reflections of two objects touching the surface (or a leading and trailing edge of one object). It should be understood that signals 550-556 are exemplary and the actual shape of the energy received can be different in practice.

In some examples, the timing parameter can be a moment in time that can be derived from the reflected energy. For example, the time can refer to that time at which a threshold amplitude of a packet of the reflected energy is detected. In some examples, rather than a threshold amplitude, a threshold energy of the packet of reflected energy can be detected, and the time can refer to that time at which a threshold energy of the packet is detected. The threshold amplitude or threshold energy can indicate the leading edge of the object in contact with the surface. In some examples, the timing parameter can be a time range rather than a point in time. To improve the resolution of a TOF-based sensing scheme, the frequency of the ultrasonic wave and sampling rate of the receivers can be increased (e.g., so that receipt of the reflected wave can be localized to a narrower peak that can be more accurately correlated with a moment in time).

In some examples, transducers 502A-D can operate in a time multiplexed manner, such that each transducer transmits and receives an acoustic wave at a different time during a measurement cycle so that the waves from one transducer do not interfere with waves from another transducer. In other examples, the transducers can operate in parallel or partially in parallel in time. The signals from the respective transducers can then be distinguished based on different characteristics of the signals (e.g., different frequencies, phases and/or amplitudes).

Figure 5D:
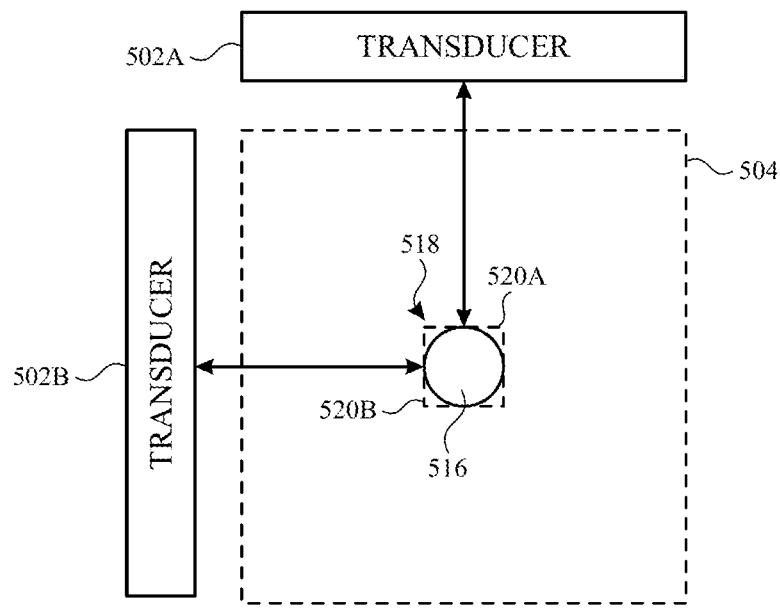

Although four transducers are illustrated in FIG. 5A, in some examples, fewer transducers can be used. For example, when using an input object with known dimensions, as few as two transducers can be used. FIG. 5D illustrates an exemplary acoustic touch sensing system configuration using two acoustic transducers 502A and 50B mounted along two perpendicular edges (e.g., one horizontal edge and one vertical edge) of a surface 500 (surface 500 is omitted for clarity of illustration). An object in contact within the active area 504 of the surface (represented by touch 516) can be an object with known dimensions. For example, a stylus tip can have a known size and shape (e.g., a diameter of 1-2 mm). As described above with respect to FIG. 5A, a first distance illustrated by boundary line 520A can be measured by the TOF of an acoustic wave transmitted and received by transducer 502A, and a second distance illustrated by boundary line 520B can be measured by the TOF of an acoustic wave transmitted and received by transducer 502B. Based on the known dimensions of object, bounding box 518 can be formed (e.g., by adding the diameter of object to the first and second distances). Based on the bounding box, the acoustic touch sensing system can determine position of touch 516 (e.g., based on a centroid). In some examples, the position can be determined based on the two measured distances without requiring forming the bounding box (e.g., the position estimating algorithm can use the dimensions of the object and the two measured distances to calculate the centroid).

In some examples, a user's finger(s) can be characterized such that a two transducer scheme can be used to detect touches by one or more fingers. In some examples, user input can be primarily from an index finger. The user's index finger can be characterized (e.g., dimensions or size) and the bounding box scheme can be applied using two TOF measurements and the finger characteristics. In some examples, multiple fingers can be characterized. During operation, the finger(s) can be identified and then the characteristics of the identified finger(s) can be used with two TOF measurements to determine position.

Figure 5E:
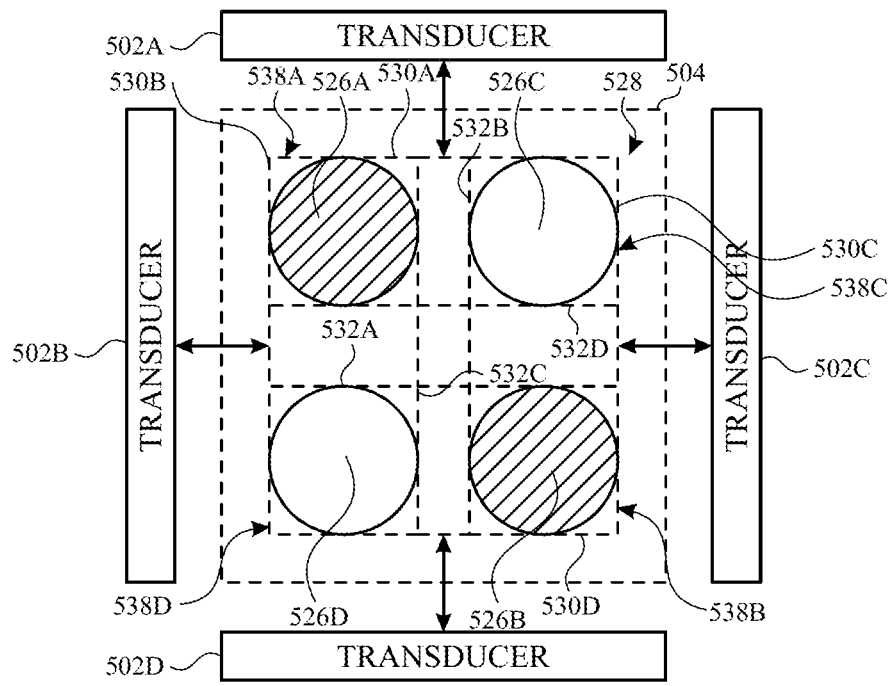

FIGS. 5A and 5D illustrate detection of a single object. In some examples, however, the acoustic touch sensing system can be configured to detect multiple touches. FIG. 5E illustrates an exemplary acoustic touch sensing system configuration configured to detect multiple touches. The acoustic touch sensing system can include four acoustic transducers 502A-502D and an active area 504 as described above with respect to FIG. 5A. Instead of one object touching within active area 504, in FIG. 5E two objects can be touching within the active area 504. The two objects, however, can create an ambiguity in the acoustic touch sensing system regarding the positions of the two objects. The two objects can correspond to either touches 526A and 526B or to touches 526C and 526D. Two of the touches can be actual touches and the other two of the touches can be phantom touches.

For example, TOF measurements can be performed by using transducers 502A, 502B, 502C and 502D to determine a distance to the two objects. For example, transducer 502A can receive two packets of reflected acoustic energy corresponding to the two objects (e.g., as illustrated in FIG. 5C, for example). A first TOF distance to the edge of either touch 526A or touch 526C can be marked by boundary line 530A, and a second TOF distance to the edge of either touch 526B or touch 526D can be marked by boundary line 532A. Likewise, transducer 502B can be used to determine a boundary line 530B corresponding to touch 526A or touch 526D, and a boundary line 532B corresponding to touch 526B or touch 526C. Transducer 502C can be used to determine a boundary line 530C corresponding to touch 526B or touch 526C, and a boundary line 532C corresponding to touch 526A or touch 526D. Transducer 502D can be used to determine a boundary line 530D corresponding to touch 526B or touch 526D, and a boundary line 532D corresponding to touch 526A or touch 526C. Taken together, boundary lines 530A-D and 532A-D can form bounding boxes 538A-D. For example, bounding box 538A can be formed from boundary lines 530A, 530B, 532C and 532D. Similarly, bounding box 538D can be formed from boundary lines 532A, 530B, 532C and 530D.

In some examples, the two actual touches can be disambiguated when they are sequential. The first touch can be registered and then the second sequential touch can be disambiguated based on the first touch. For example, in the example illustrated in FIG. 5E, if touch 526A is detected first, then in the subsequent measurement cycle the two touches can be determined to be touches 526A and 526B. In contrast, if touch 526C is detected first, then in the subsequent measurement cycle the two touches can be determined to be touches 526C and 526D. As long as the touches remain far enough apart to be resolved into separate bounding boxes (and assuming the touch contact moves only small amounts between each measurement interval), the two touches can be tracked. In practice, the apparently simultaneous multi-touch by a user can be viewed as sequential touches if the acquisition time (measurement cycle) of the acoustic sensors is short enough to register the sequence. Thus, if the measurement cycle repeats frequently enough, the acoustic touch sensing system can disambiguate the multiple touches with four transducers.

In some examples, e.g., when multiple touches cannot be resolved, bounding box 528 can be used to determine the position of touch. Bounding box 528 can be formed from boundary lines 530A-D.

Figure 5F:
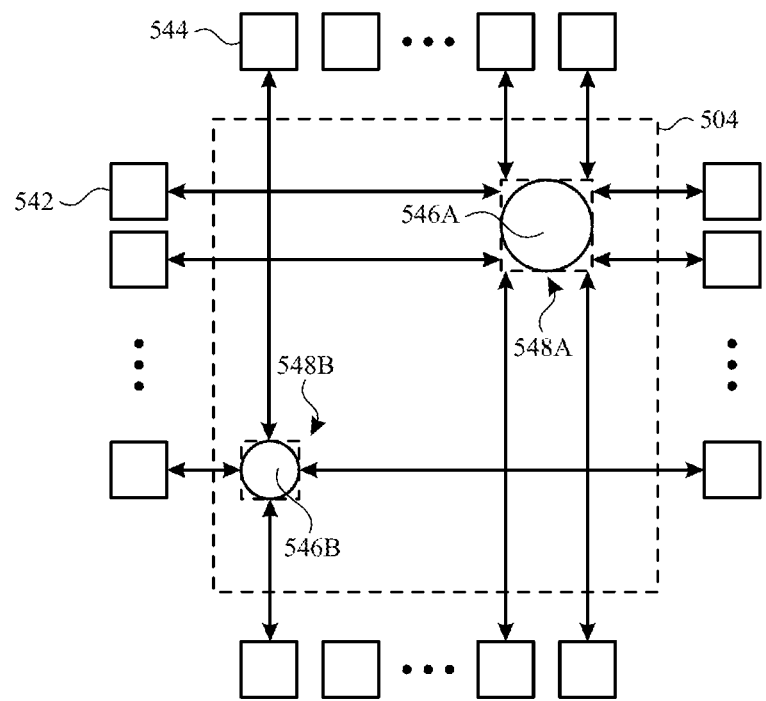

The multi-touch capabilities described with reference to FIG. 5E can be limited based on the disambiguation requirements (e.g., sequential contact and tracking). In some examples, multi-touch capabilities can be provided by increasing the number of transducers in the system. FIG. 5F illustrates an exemplary acoustic touch sensing system configuration configured to detect multiple touches. The acoustic touch sensing system in FIG. 5F can include one or more transducers 542 and 544 arranged along edges of the surface and forming active area 504. Each of the transducers 542 and 544 can transmit acoustic waves and measure the reflections to determine the presence and location of one or more objects. For example, as illustrated, bounding box 548A can be formed around touch 546A based on TOF measurements from eights transmitters, and bounding box 548B can formed around touch 546B based on TOF measurements from four of the transmitters. Multiple transducers can also be implemented in place of the two transducers illustrated in FIG. 5D.

In some examples, the arrangement of multiple transducers illustrated in FIG. 5F can be implemented without the multi-touch capability described with respect to FIG. 5F. Instead, the multiple transducers on each of the sides can be coupled together and can act as a single transducer on each of the four sides as described with reference to FIGS. 5A and 5E (or on two sides as described with reference to FIG. 5D).

TOF schemes described with reference to FIGS. 5A-5F can provide for touch sensing capability using a limited number of transducers (e.g., as compared with capacitive touch sensing) which can simplify the transmitting and receiving electronics, and can reduce time and memory requirements for processing. Although FIGS. 5A-5F discuss using a bounding box based on TOF measurements to determine position of an object, in other examples, different methods can be used, including applying matched filtering to a known transmitted ultrasonic pulse shape, and using a center of mass calculation on the filtered output (e.g., instead of a centroid). Additionally, although touch sensing is primarily described, the acoustic transducers can additionally or alternatively be used for force sensing.

Referring back to FIG. 5A, the acoustic touch sensing system configuration can use four separate acoustic transducers 502A-D mounted to four edges of a surface 500. The four separate acoustic transducers, however, may leave portions of the surface 500 outside of active area 504 without touch sensing capabilities. Additionally, the rectangular (linear) shaped transducers as shown in FIG. 5A may be suitable for a rectangular or square (linear) surface 500, but rectangular (linear) shaped transducers may be less suitable or unsuitable for a surface with curves. As described below, in some examples, a transducer with a curved shape can be used to improve the integration of transducers with curved surfaces and/or to expand the active area of a touch surface with curves. In particular, piezoelectric material with curves can be used to expand sensing coverage for a planar waveguide with a curved shape (e.g., cover glass with a partially circular or circular shape). The transducers formed from a piezoelectric material with curves can be operated in a similar manner as transducers 502A-D of FIG. 5A, and further description of their operation is omitted.

Figure 6A:
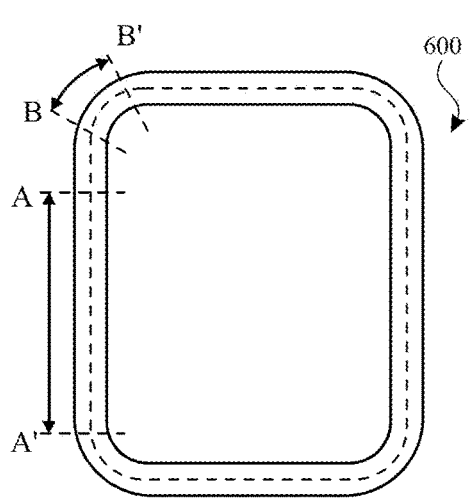
FIGS. 6A-6E illustrate exemplary piezoelectric materials including curves according to examples of the disclosure.

FIGS. 6A-6E illustrate exemplary piezoelectric materials including curves according to examples of the disclosure. For example, FIG. 6A illustrates a top view of an exemplary piezoelectric material 600 that can be used to implement one or more acoustic transducers according to examples of the disclosure. Piezoelectric material 600 can have a shape similar to that of the device in which it may be integrated (e.g., mobile telephone 136, tablet computer 148 or wearable device 150, etc.). For example, piezoelectric material 600 can be largely rectangular, but can include curved corners (e.g., four elbow shaped curves). In some examples, the dimensions of the piezoelectric material 600 can be substantially the same (e.g., subject to assembly constraints of the device) as the dimensions of a cover glass of the devices or the same as the dimensions of the touch screen of the device (within a threshold of the size/dimensions of the device/touch screen).

As illustrated in FIG. 6A, the piezoelectric material 600 can form a closed ring. Using a closed ring can simplify the structural integration of the device including the acoustic transducers and can improve the structural integrity of the system. Multiple transducers can be formed by patterning electrodes on the piezoelectric material 600 instead of requiring a separate piezoelectric structure for each transducer. For example, electrodes can be patterned on linear segments of piezoelectric material 600 to form four transducers equivalent to transducers 502A-D and electrodes can be patterned on the curved segments of piezoelectric material 600 to form four transducers at the elbows between the linear segments of the piezoelectric material 600.

Figure 6B:
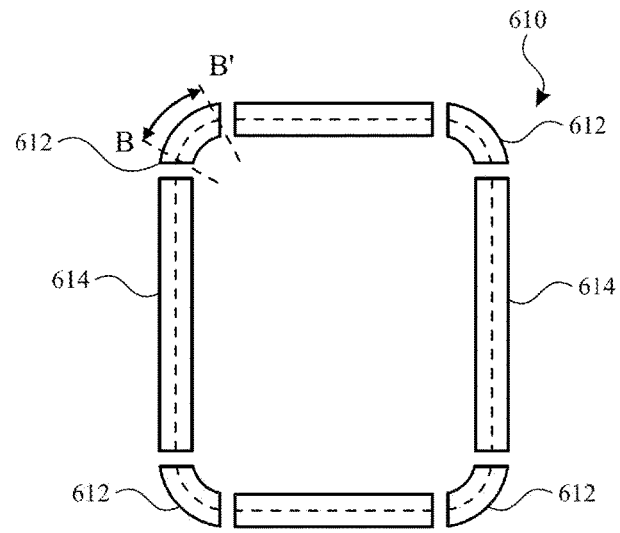

In some examples, rather than using a single structure and/or a closed ring structure, transducers can be implemented discretely including separate curved and non-curved piezoelectric materials. FIG. 6B illustrates a top view illustrates a top view of an exemplary configuration 610 of piezoelectric materials including curved and linear piezoelectric materials according to examples of the disclosure. For example, configuration 610 can approximate piezoelectric material 600 with four curved piezoelectric materials 612 and four linear piezoelectric materials 614 as illustrated in FIG. 6B.

Figure 6C:
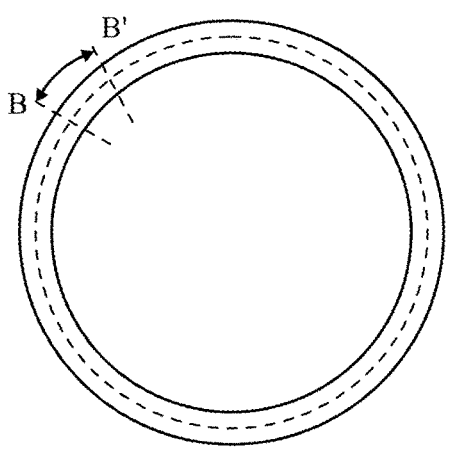
Figure 6D:
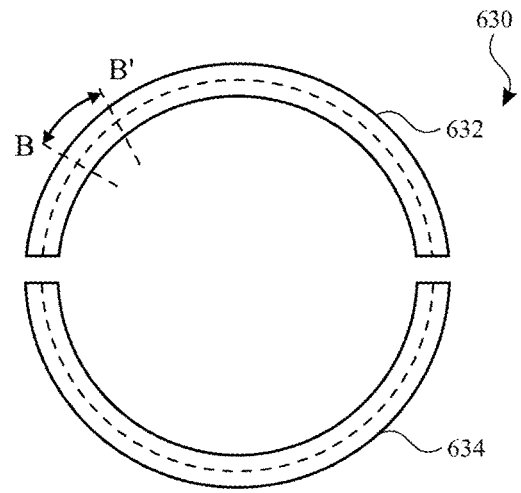

In some examples, the cover glass or surface may have a different shape and use correspondingly differently shaped piezoelectric materials. For example, FIG. 6C illustrates a piezoelectric material 620 having a circular shaped (e.g., closed ring) that can be suitable for a round shaped device or display. One or more transducers can be implemented using piezoelectric material 620 by patterning electrodes on segments of piezoelectric material 620 according to the desired number and location of the transducers. FIG. 6D illustrates a configuration 630 of piezoelectric materials including two semi-circular shaped piezoelectric materials 632 and 634. Piezoelectric materials 632 and 634 can approximate piezoelectric material 620.

Figure 6E:
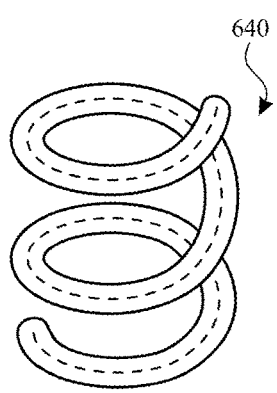

Although FIGS. 6A-D illustrate piezoelectric materials including planar curves (when viewed from the top), the piezoelectric material can include non-planar curves. For example, FIG. 6E illustrates a spiral shaped piezoelectric material. It should be understood that the shapes of piezoelectric materials illustrated in FIGS. 6A-E are exemplary planar and non-planar shapes, but other shapes including curves can be implemented (e.g., parabolic, ellipse, sphere, etc.)

Figure 7:
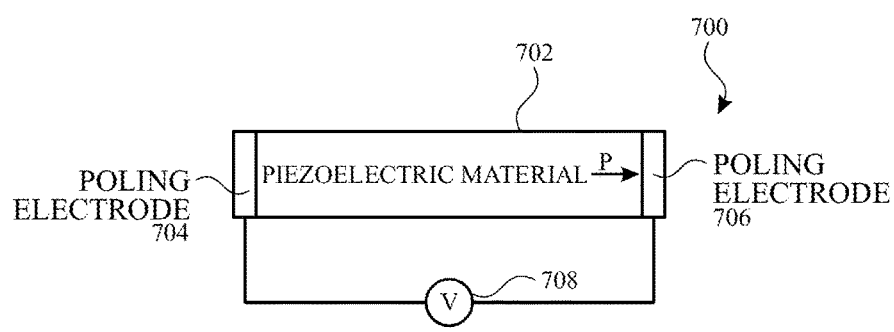
FIG. 7 illustrates an exemplary configuration for shear poling a linear piezoelectric material according to examples of the disclosure.

As discussed herein, acoustic touch sensing can include generating shear waves in a surface using piezoelectric transducers. To improve performance of an acoustic touch sensing system, it can be desirable to stimulate the piezoelectric transducers to generate energy in a desired shear mode (or more than one desired shear mode) and reduce energy in undesired modes (parasitic modes). Poling (e.g., using electric fields) can be performed to form electrical dipoles in a preferred direction (i.e., poling direction) so that excitation of the piezoelectric material can generate energy predominantly or solely in the mode of interest and reduce or eliminate parasitic modes. For example, FIG. 7 illustrates an exemplary configuration 700 for shear poling a linear piezoelectric material according to examples of the disclosure. FIG. 7 illustrates a piezoelectric material 702 without curves. For example, piezoelectric material 702 can correspond to a side view of one of linear piezoelectric materials 614 or a side view of a cross section along A-A' of a linear segment of piezoelectric material 600. To shear pole linear piezoelectric material 702, poling electrodes 704 and 706 can be placed on opposite ends of the piezoelectric material.

A voltage can be supplied across piezoelectric material 702 via poling electrodes 704 and 706 to generate an electric field across piezoelectric material 702 in the direction shown by the arrow (P→). The poling direction for a linear piezoelectric material 702 can be linear in the direction between the two poling electrodes 704 and 706. In some examples, the poling can be performed by applying a threshold voltage (e.g., to generate an electric field on the order of 1-100 kV/mm) across the piezoelectric material for a threshold period of time (e.g., 1-20 minutes), optionally in an oil (e.g., silicone oil) heated to a threshold temperature (e.g., 80° C.). In some examples, the duration of time and applied voltage (and corresponding electric field) can be traded off (e.g., a larger voltage may be applied for a shorter duration to achieve the desired poling characteristic). The poling process can form electric dipoles in the direction of the electric field that can remain after the electric field is removed. The electric dipoles formed in a uniform direction can allow for a more uniform behavior increasing the energy in a desired shear mode of operation and decreasing energy in parasitic modes.

As illustrated in FIG. 7, shear poling a linear piezoelectric material can be accomplished using poling electrodes placed on the ends of the linear piezoelectric material and the poling can be linear between the ends of the linear piezoelectric material. For a piezoelectric material with a closed curved shape, however, the ends of the piezoelectric material may not be accessible for shear poling. For example, the ends of the linear segment of piezoelectric material 600 indicated by cross-section A-A' in FIG. 6A is not accessible to poling electrodes 704 and 706. Furthermore, for a piezoelectric material with a curved shape, shear linear poling using two electrodes at opposite ends of the piezoelectric material (e.g., elbow shaped piezoelectric material 612 in FIG. 6B) can result in poling direction that diverges from the curvature of the piezoelectric material. Such shear poling can result in irregular behavior including reduced or no energy in the mode of interest and increased energy in parasitic modes. As illustrated in FIGS. 6A-6E, the poling direction for shear poling, shown by the dashed lines, can follow the curvature of the material to improve efficiency (i.e., to reduce parasitic modes).

Figure 8A:
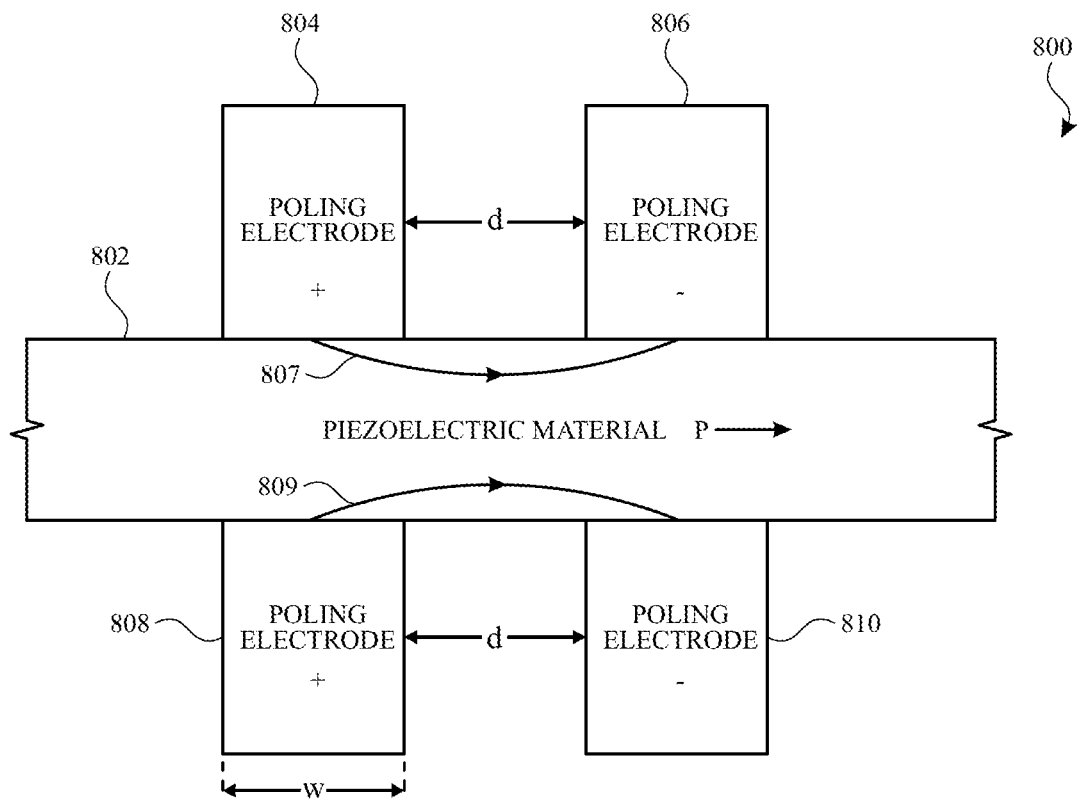
FIGS. 8A-B illustrate exemplary poling configurations for shear poling linear segments and curved segments of a piezoelectric material according to examples of the disclosure.
Figure 8B:
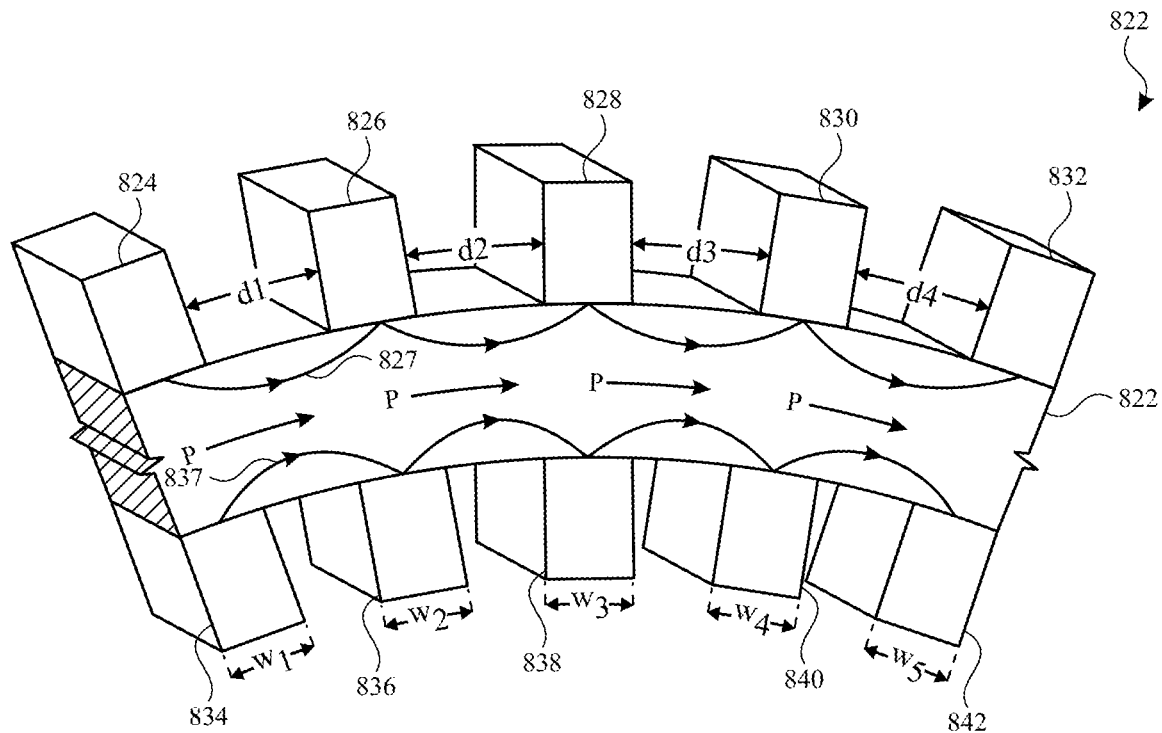

FIGS. 8A-B illustrate exemplary poling configurations 800 and 820 for shear poling linear segments and curved segments of a piezoelectric material according to examples of the disclosure. FIG. 8A illustrates a piezoelectric material 802 without curves. For example, piezoelectric material 802 can correspond to a side view of a cross section along A-A' of a linear segment of piezoelectric material 600 in FIG. 6A. To shear pole linear piezoelectric material 802, poling electrodes 804 and 806 can be placed on top of the piezoelectric material (e.g., the surface shown in the top view of FIG. 6A). A voltage can be supplied between poling electrodes 804 and 806 to generate a local electric field in piezoelectric material 802. As illustrated by electric field line 807, an electric field can be introduced into piezoelectric material between the poling electrodes 804 and 806. Although the field lines may not be strictly linear in this configuration (unlike in FIG. 7A), the segment of piezoelectric material between poling electrodes 804 and 806 can be shear poled in the direction shown by the arrow (P→). In addition to shear poling using poling electrodes 804 and 806, poling electrodes 808 and 810 can be placed on bottom of the piezoelectric material (opposite poling electrodes 804 and 806). A voltage can be supplied between poling electrodes 808 and 810 to generate an electric field in piezoelectric material 802. As illustrated by electric field line 809, an electric field can be introduced into piezoelectric material between the poling electrodes 808 and 810. Although the field lines may not be strictly linear in this configuration, the segment of piezoelectric material between poling electrodes 808 and 810 can be shear poled in the direction shown by the arrow (P→). In some examples, the poling by electrodes 804 and 806 and the poling by electrodes 808 and 810 can occur at the same time to strengthen the total electric field in the poling direction and/or to cancel out the non-linear poling direction components. As a result of the shear poling, a segment of the piezoelectric material between the poling electrodes can be poled in a linear direction to follow the trajectory of the linear segment. As discussed herein, the process can be repeated for additional segments to shear-pole some or all of the piezoelectric material.

FIG. 8B illustrates a piezoelectric material 822 with curves. For example, piezoelectric material 822 can correspond to a side view of a cross section along B-B' of a curved segment of piezoelectric materials 600, 612, 620 or 630 in FIGS. 6A-6D. To shear-pole curved piezoelectric material 822, poling electrodes 824 and 826 can be placed on top of the piezoelectric material (e.g., the surface shown in the top views of FIGS. 6A-D). A voltage can be supplied between poling electrodes 824 and 826 to generate an electric field in piezoelectric material 822. As illustrated by electric field line 827, an electric field can be introduced into piezoelectric material. Although the field lines may not strictly follow the curvature, the segment of piezoelectric material between poling electrodes 824 and 826 can be shear poled in the direction shown by the arrow (P→), which can approximate (linearly) the curvature of the piezoelectric material between the poling electrodes. In other words, the poling direction for the segment can be tangential to the curvature of the segment (or within a threshold of the line tangent to the curvature of the segment). In addition to shear poling using poling electrodes 824 and 826, poling electrodes 834 and 836 can be placed on bottom of the piezoelectric material (e.g., opposite poling electrodes 824 and 826). A voltage can be supplied between poling electrodes 834 and 836 to generate an electric field in piezoelectric material 822. As illustrated by electric field line 837, an electric field can be introduced into piezoelectric material. Although the field lines may not strictly follow the curvature, the segment of piezoelectric material between poling electrodes 834 and 836 can be shear poled in the direction shown by the arrow (P→), which can approximate (linearly) the curvature of the piezoelectric material between the poling electrodes. In some examples the poling by electrodes 824 and 826 and the poling by electrodes 834 and 836 can occur at the same time to strengthen the total electric field and/or to cancel out portions of poling direction components not following the curvature of the piezoelectric material. As a result of the poling, a segment between the poling electrodes can be poled to follow the trajectory of the curvature of the segment (e.g., approximated by linearly poling segments). As discussed herein, the process can be repeated for additional segments by applying a voltage between adjacent poling electrodes (e.g., between electrodes 826, 828, 830, 832 and between electrodes 836, 838, 840 and 842) to shear-pole some or all of the piezoelectric material.

It should be understood that the poling configuration of FIGS. 8A and 8B may not result in a poling direction exactly matching the linear or curved trajectory of the piezoelectric material. In some examples, the poling can be performed so that the poling direction of the piezoelectric material can be within a threshold amount of the trajectory of the curved material (e.g., within 1%, 5%, etc.). In some examples, the poling can be performed so that a threshold percentage (e.g., 80%, 95%, etc.) of the total energy can be generated in the desired shear mode and/or so that less than a percentage of the total energy generated in the parasitic mode can be less than a threshold (e.g., 5%, 10%, etc.).

As discussed above, the linear shear poling process of FIG. 7 can be a function of the poling voltage (and corresponding electric field) across the piezoelectric material and poling time. Additionally, the shear poling processes illustrated in FIGS. 8A and 8B for linear and curved segments can be a function of the width of the poling electrodes and of the separation distance between poling electrodes. For example, decreasing the width of the poling electrodes and/or decreasing the separation distance between poling electrodes can allow for increasing the density of segments for a piezoelectric material. Increasing the density of segments can result in poling smaller segments so that the shear poling direction better approximates the curvature (or linearity) of each segment. In some examples, the distance between poling electrodes and/or the width of poling electrodes can be the same for poling the entire piezoelectric material. In some examples, the distance between poling electrodes and/or the width of poling electrodes can be different for poling different segments of the piezoelectric material. For example, to better approximate the curvature of a curved segment of the piezoelectric material, the spacing between poling electrodes can be decreased and/or the width of the poling electrodes can be reduced as compared with the distance and/or width for a linear segment of the piezoelectric material.

Referring back to FIGS. 8A-8B, the distance d between poling electrodes 804 and 806 for poling a linear segment can be larger than distances $d_1$-$d_4$ between poling electrodes 824, 826, 828, 830 and 832 for a curved segment (i.e., d>$d_1$-$d_4$). In some examples, the distance $d_1$-$d_4$ between poling electrodes 824, 826, 828, 830 and 832 can be uniform for curved segments (i.e., $d_1$=$d_2$=$d_3$=$d_4$). In some examples, the distance between poling electrodes can be different for different curved segments, where the separation distance can be a function of the curvature (smaller distance for segments with more curvature). Additionally or alternatively, the width w of the poling electrodes for a linear segment can be larger than the widths $w_1$-$w_5$ of poling electrodes for curved segments (i.e., w>$w_1$-$w_5$). In some examples, the widths $w_1$-$w_5$ can be uniform for poling electrodes for curved segments (i.e., $w_1$=$w_2$=$w_3$=$w_4$=$w_5$). In some examples, the width of poling electrodes can be different for different curved segments, where the width can be a function of the curvature (smaller width for segments with more curvature).

Figure 9A:
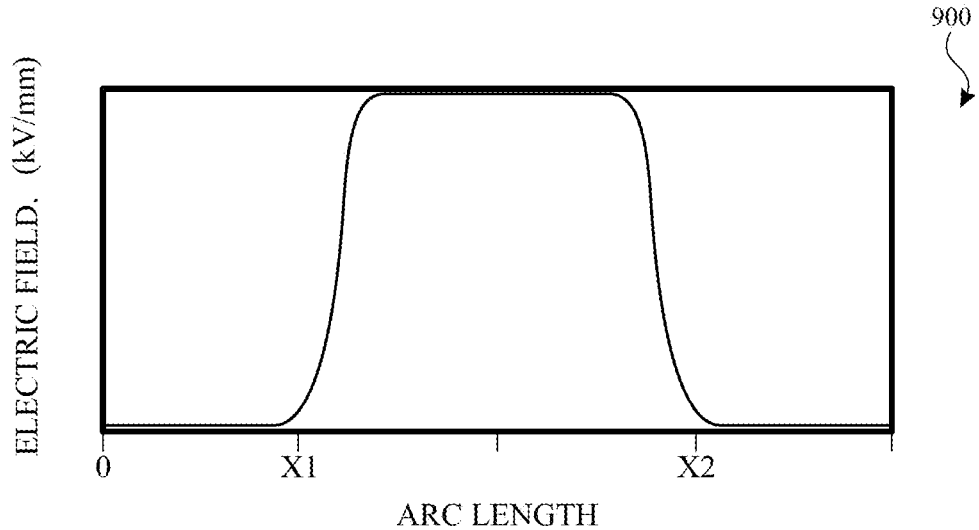
FIGS. 9A-C illustrate exemplary plots of electric fields generated in a poling direction and in non-poling directions for an exemplary poling operation according to examples of the disclosure.
Figure 9B:
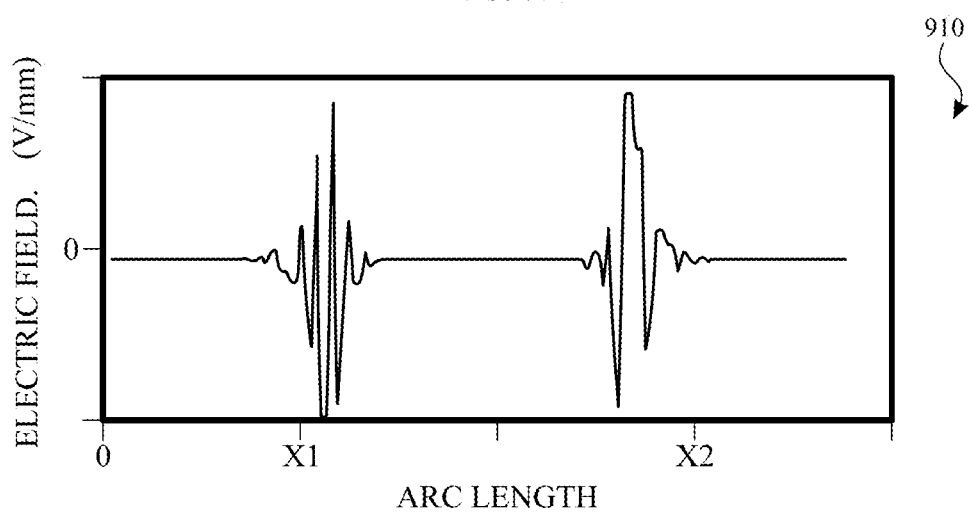
Figure 9C:
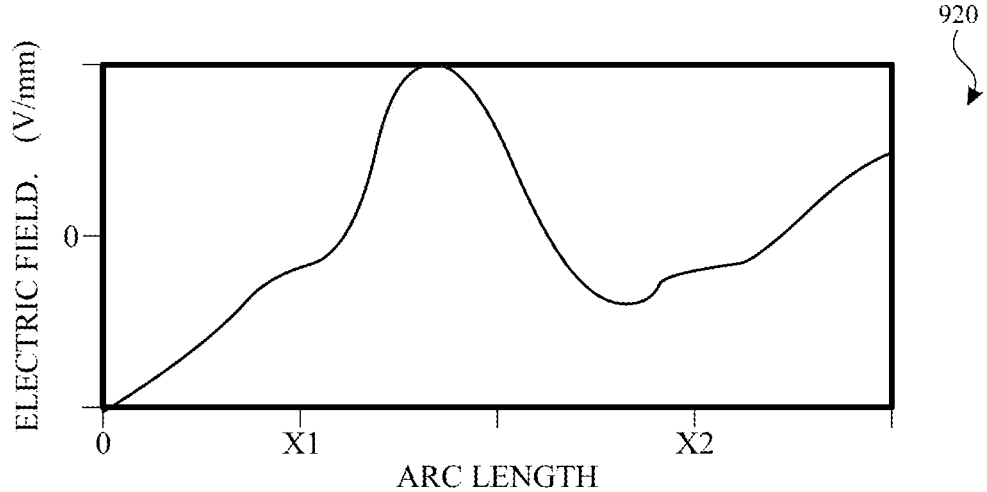

FIGS. 9A-C illustrate exemplary plots of electric fields generated in the poling direction and in non-poling directions for an exemplary poling operation corresponding to the poling configuration 800 of FIG. 8A according to examples of the disclosure. Plot 900 in FIG. 9A, for example, illustrates the electric field in the poling direction. One or more poling electrodes (e.g., corresponding to poling electrodes 804 and/or 808) can be situated at position x1 and one or more poling electrodes (e.g., corresponding to poling electrodes 806 and/or 810) can be situated at position x2. The voltage can be applied between the electrodes situation at x1 and the electrodes x2 to generate an electric field in the segment between the poling electrodes. Ideally, the electric field between x1 and x2 should be large and uniform, and zero elsewhere, and the transition regions near x1 and x2 should resemble an ideal step. Plot 900 illustrates an exemplary electric field that can approximate a step function with a substantially uniform (within an error tolerance) electric field for most of the segment of piezoelectric material between electrodes at x1 and x2 and substantially zero (or below a threshold) outside the segment of piezoelectric material between electrodes at x1 and x2. Plots 910 and 920, for example, illustrate the electric field in directions perpendicular to the shear poling direction. It should be understood that the electric field generated in non-poling directions shown in plots 910 and 920 can be multiple orders of magnitude smaller than the electric field generated in the shear poling direction in plot 900. For example, the peak electric field in plot 900 can be on the order of 3 kV/mm and the peak electric field in plots 910 and 920 can be on to order of 0.1-10V/mm.

Figure 10:
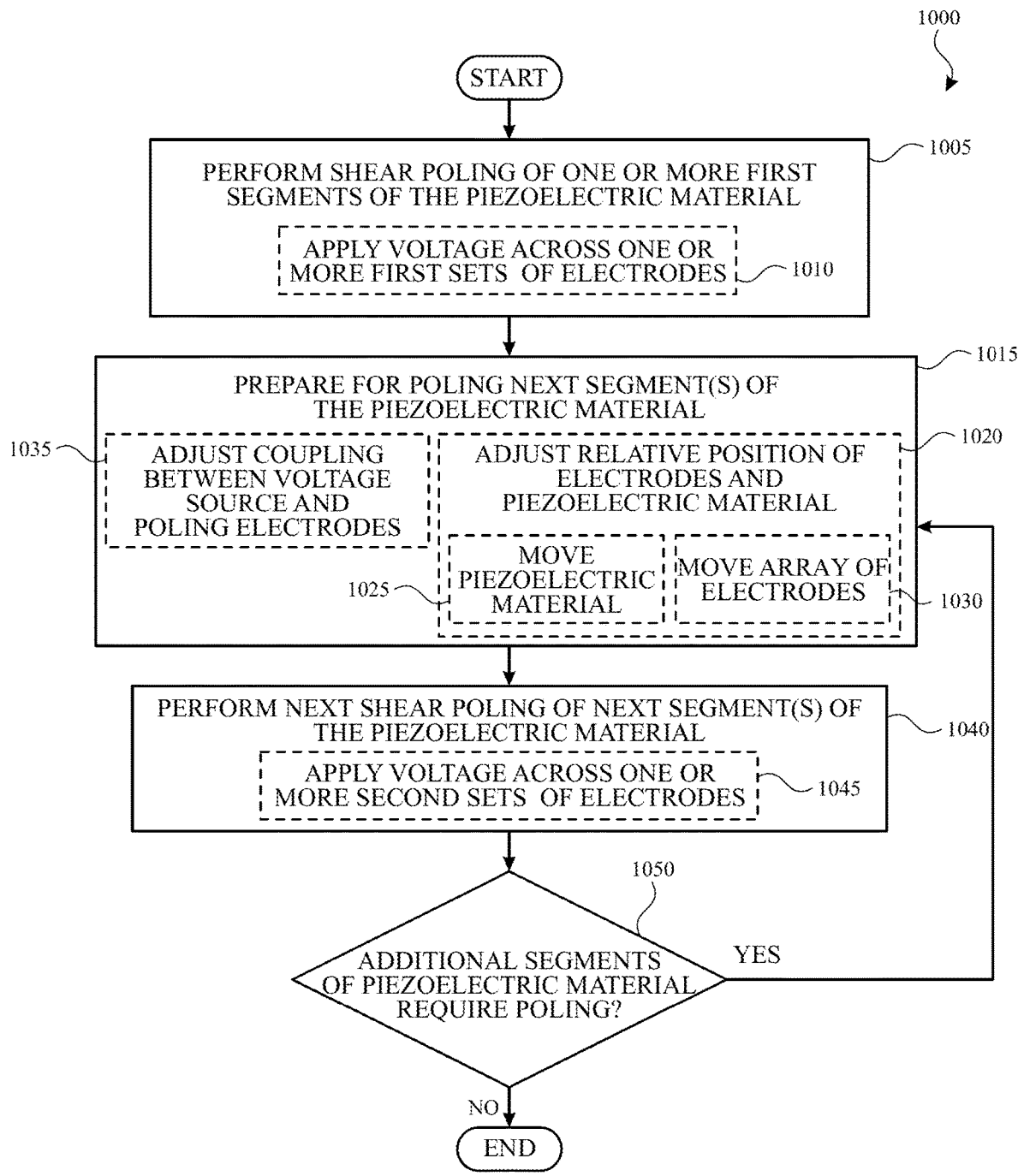
FIG. 10 illustrates an exemplary process for shear poling a piezoelectric material including one or more curves according to examples of the disclosure.

As described above, shear poling according to configurations 800 and 820 can be repeated for multiple segments of a piezoelectric material to compete shear poling of the piezoelectric material. FIG. 10 illustrates an exemplary process 1000 for shear poling a piezoelectric material including one or more curves according to examples of the disclosure. At 1005, one or more first segments of the piezoelectric material can be shear-poled. For example, each of the one or more first segments can be shear poled by applying a voltage between one or more first sets of poling electrodes (1010). Poling a linear segment, for example, can be performed by applying a voltage across a set of two poling electrodes (804, 806) on a first side of the piezoelectric material and/or across a set of two poling electrodes (808, 810) on a second side of the piezoelectric material, as illustrated in configuration 800 in FIG. 8A. Poling a curved segment, for example, can be performed by applying a voltage across a set of two poling electrodes (e.g., 824, 826) on a first side of the piezoelectric material and/or across a set of two poling electrodes on a second side of the piezoelectric material (e.g., 834, 836), as illustrated in configuration 820 in FIG. 8B. At 1015, the poling configuration can be adjusted to prepare for shear poling one or more different (next) segments of the piezoelectric material. In some examples, the relative position of one or more sets of poling electrodes and the piezoelectric material can be adjusted (1020). In some examples, one or more sets of poling electrodes can remain stationary and the piezoelectric material can be moved with respect to the one or more sets of poling electrodes (1025). In some examples, the piezoelectric material can remain stationary and the one or more sets of poling electrodes can be moved (1030). In some examples, the poling electrodes and piezoelectric material can remain stationary and coupling between the voltage source(s) and poling electrodes can be adjusted (1035). For example, sets of electrodes can be active or inactive according to the poling process. In some examples, combinations of the above adjustments can be performed to prepare for poling the one or more different segments. At 1040, one or more next segments of the piezoelectric material can be shear-poled. For example, each of the one or more next segments can be shear poled by applying a voltage between one or more second sets of poling electrodes (1045). In some examples, the one or more second sets of poling electrodes can be the same as the one or more first sets of poling electrodes (e.g., when the relative position of electrodes/piezoelectric material can change). In some examples, the one or more second sets of poling electrodes can be different sets of poling electrodes (e.g., when the electrodes and piezoelectric material positions can be fixed). Poling a linear segment or curved segment can be performed using the configurations of FIGS. 8A-8B. At 1050, a determination can be made about whether there are additional segments to shear pole. If there are additional segments, the poling configuration can again be adjusted to prepare for shear poling one or more different segments of the piezoelectric (1015) material and then to shear pole the one or more different segments (1040). If there are no additional segments, the poling process can end. After poling, the electrodes can be patterned on the piezoelectric material to form the transducer electrodes.

It should be understood that process 1000 can be performed by firmware stored in memory or stored in program storage and executed by processor of a shear poling system. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding a signal) that can contain or store the program for use by or in connection with the instruction execution system, apparatus, or device. The non-transitory computer readable medium storage can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like. The shear poling system can also include one or more sets of poling electrodes (or one or more arrays of poling electrodes), one or more voltage supplies, and/or switching circuitry to couple the one or more voltage supplies to the one or more sets of the electrodes.

FIGS. 11-15 illustrate various exemplary configurations for shear poling a piezoelectric material with one or more curves (e.g., using process 1000) according to examples of the disclosure. FIG. 11 illustrates a top view of an exemplary configuration 1100 including a piezoelectric material 1102 with curves (e.g., corresponding to piezoelectric material 600). During a shear poling process, an array of poling electrodes 1104 can be coupled to piezoelectric material 1102. In some examples, a first array of poling electrodes 1104 can be coupled to the top side of the piezoelectric material 1102 and a second array of poling electrodes 1104 can be coupled to the bottom side of the piezoelectric material 1102. During a first time period $t_1$ a voltage can be applied to two electrodes (e.g., two adjacent electrodes) to generate an electric field therebetween for shear poling a segment of the piezoelectric material between the two electrodes. The voltage can be applied to two electrodes on the top and/or bottom depending on whether the array of poling electrodes is coupled to the top and/or bottom of the piezoelectric material. During a second time period $t_2$, the voltage can be applied between two other electrodes (e.g., two adjacent electrodes) to shear pole a second segment. The process can continue during periods $t_3$-$t_n$, to shear pole the remaining segments of the piezoelectric material. In some examples, the poling of different segments at each time period can be accomplished by switching the coupling between the voltage source and the sets of poling electrodes (e.g., with switching circuitry). Alternatively, a set of two electrodes rather than an array of electrodes can be coupled to a voltage supply and the second set of electrodes and/or the piezoelectric material can be moved to adjust the relative position between the poling electrodes and the piezoelectric material to pole the different segments during the different time periods. Although FIG. 11 illustrates serially poling segments in a clock-wise pattern, any order can be applied.

In some examples, the shear poling process can be sped up by poling multiple segments of the piezoelectric material during each time period. FIG. 12 illustrates a top view of an exemplary configuration 1200 including a piezoelectric material 1202 with curves (e.g., corresponding to piezoelectric material 600). During shear poling an array of poling electrodes 1204 can be coupled to piezoelectric material 1202. In some examples, a first array of poling electrodes 1204 can be coupled to the top side of the piezoelectric material 1202 and a second array of poling electrodes 1204 can be coupled to the bottom side of the piezoelectric material 1202. During a first time period $t_1$ a voltage can be applied to sets of two electrodes (active sets). For each respective active set of two electrodes, the applied voltage can generate a respective electric field between the respective set of two electrodes to shear pole a respective segment of the piezoelectric material between the respective set of two electrodes. The voltage can be applied to sets of two electrodes on the top and/or bottom depending on whether the array of poling electrodes is coupled to the top and/or bottom of the piezoelectric material. The remaining electrodes can be inactive. During a second time period $t_2$, the voltage can be applied between other active sets of two electrodes to shear pole a set of second segments. The remaining electrodes can be inactive. The process can continue during periods $t_3$-$t_n$, to shear pole the remaining sets of segments of the piezoelectric material. For example, as illustrated in FIG. 12, the piezoelectric material 1202 can be poled with 48 poling electrodes during eight time periods, with six sets of poling electrodes active during each time period. In some examples, the poling during each time period can be accomplished by switching the coupling between the voltage source and the sets of poling electrodes (e.g., with switching circuitry). Alternatively, sets of electrodes (e.g., six sets as illustrated in FIG. 12) rather than an array of electrodes can be coupled to one or more voltage supplies and the sets of electrodes and/or the piezoelectric material can be moved to adjust their relative position to shear pole the sets of segments during the different time periods. Although FIG. 12 illustrates serially poling for sets of segments in a clock-wise pattern, any order can be applied.

Figure 13:
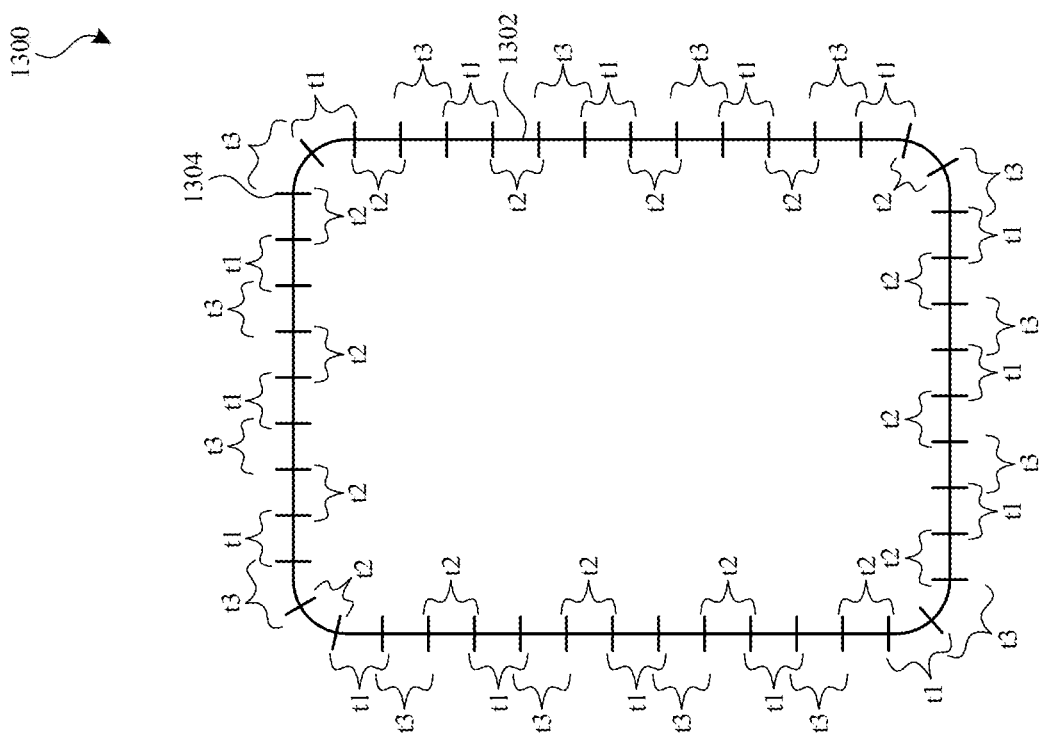

Additionally, although FIG. 12 illustrates shear poling in eight time periods, the number of time periods can be further reduced in other examples. FIG. 13, for example, illustrates a top view of an exemplary configuration 1300 including a piezoelectric material 1302 with curves (e.g., corresponding to piezoelectric material 600) and poling electrodes 1304. Unlike in FIG. 12, where six inactive poling electrodes separate respective sets of active poling electrodes, configuration 1300 reduces the separation between respective sets of active poling electrodes. For example, in FIG. 13, during each time period a respective set of active electrodes is separated by the next set of active electrodes by one inactive electrode. It should be understood that the configurations of FIGS. 12 and 13 are exemplary, and the spacing between respective sets of active poling electrodes can be smaller or larger. The minimum separation between respective sets of active poling electrodes can, in some examples, be set to avoid interaction between the active sets that can result in reverse polarization.

Figure 14:
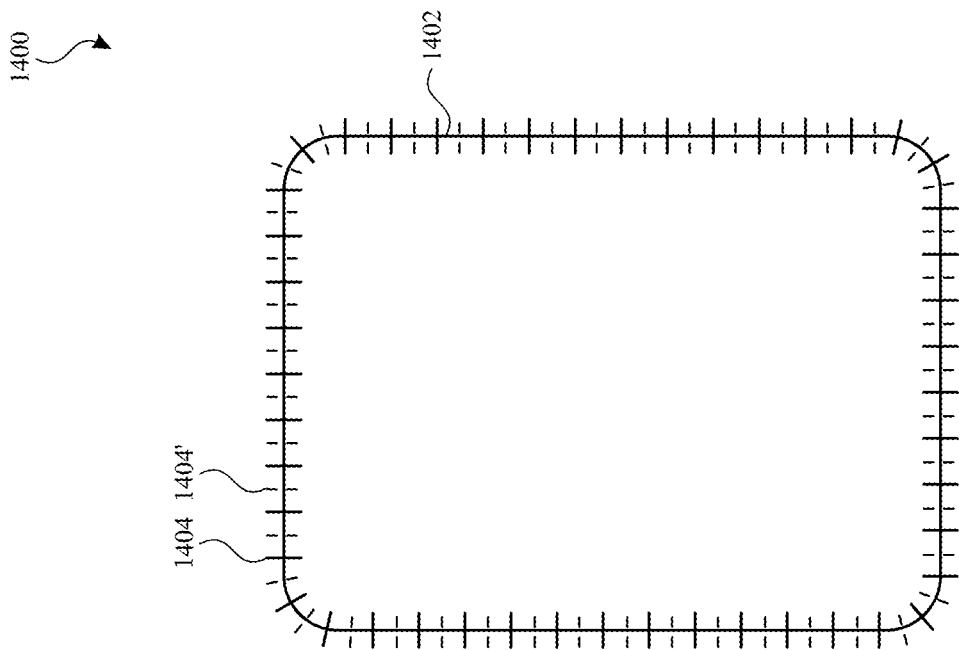
Figure 15:
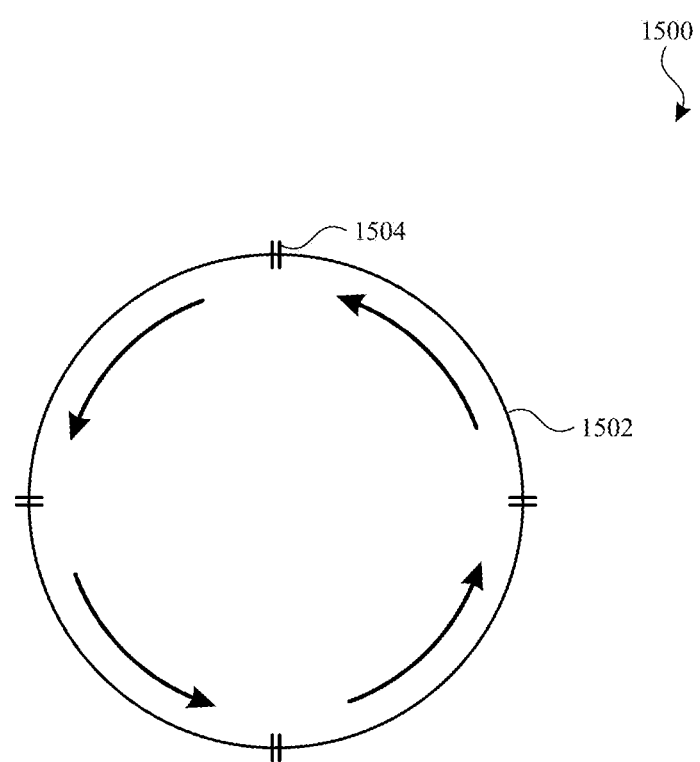

The shear poling described above can cause a polarization of a respective segment between the poling electrodes. As illustrated above with respect to FIG. 9A, the desired electric field between the poling electrodes can be applied reliably for most of the segment between the electrodes, but some portions of the segment within a threshold distance of the electrode. Additionally, portions of the piezoelectric material immediately below the electrode may not receive the desired electric field. In some examples, to ensure uniform poling across the piezoelectric material, the relative position between the poling electrodes and the piezoelectric material can be adjusted so that further poling can be performed for these segments of the piezoelectric material that may not otherwise be poled. In some examples, the array of electrodes can be shifted (e.g., a half pitch) and the poling process can be repeated. FIG. 14 illustrates an exemplary configuration 1400 for poling a piezoelectric material 1402 with one or more curves. First, shear poling can be performed using a set of poling electrodes 1404 or an array of poling electrodes 1404 (represented by solid lines). The poling can be performed according to one of the configurations of FIGS. 11-13, for example. Then the poling electrodes can be offset. For example, dashed lines of poling electrodes 1404' can represent a shift in the placement of the poling electrodes. Then shear poling can be performed again (e.g., according to one of the configurations of FIGS. 11-13). In some examples, a first array of poling electrodes corresponding to poling electrodes 1404 can be used for the first poling process and a second array of poling electrodes corresponding to poling electrodes 1404' can be used for the second poling process. Using two arrays of poling electrodes can be particularly useful when the distribution of electrodes and shape of the piezoelectric material may not provide for a simple offset between the piezoelectric material and one array of poling electrodes. Although FIG. 14 illustrates a single offset, in some examples, more than one offset can be applied and additional poling processes can be performed. FIG. 15 illustrates an exemplary configuration 1500 for poling a piezoelectric material 1502 with sets of poling electrodes 1504. Piezoelectric material can be a circular ring. One or more sets of poling electrodes 1504 can be used to shear pole one or more segments of the piezoelectric material 1502 during a time period and then the poling electrodes may be offset with respect piezoelectric material. For example, the array of electrodes and/or the piezoelectric material can rotate. After the offset, poling can be performed using the one or more sets of poling electrodes 1504. The offset and poling can be performed gradually in steps of any size desired. For example, the offset can be ⅛ of the pitch, ¼ of the pitch ½ the pitch, etc. Although FIG. 15 illustrates four sets of poling electrodes, it should be understood that more of fewer sets of poling electrodes can be used (e.g., similar to the discussion above with respect to FIGS. 11-13).

Therefore, according to the above, some examples of the disclosure are directed to a piezoelectric material comprising a curved segment. A direction of shear poling in the curved segment can follow a curvature of the curved segment. Additionally or alternatively to one or more of the examples disclosed above, in some examples, the direction of shear poling in the piezoelectric material can be unidirectional in the piezoelectric material. Additionally or alternatively to one or more of the examples disclosed above, in some examples, the piezoelectric material, when excited, can generate a threshold percentage of total energy in a selected shear mode. Additionally or alternatively to one or more of the examples disclosed above, in some examples, the direction of shear poling can be within a threshold amount of a line tangential to the curvature of the curved segment. Additionally or alternatively to one or more of the examples disclosed above, in some examples, the piezoelectric material can comprise a closed ring shape. Additionally or alternatively to one or more of the examples disclosed above, in some examples, the piezoelectric material can comprise a circular or partially circular shape. Additionally or alternatively to one or more of the examples disclosed above, in some examples, the piezoelectric material can comprise a plurality of elbow shaped segments. Additionally or alternatively to one or more of the examples disclosed above, in some examples, the piezoelectric material can comprise a plane curve. Additionally or alternatively to one or more of the examples disclosed above, in some examples, the piezoelectric material can comprise a non-planar curve. Additionally or alternatively to one or more of the examples disclosed above, in some examples, the piezoelectric material can comprise a first curved segment, a second curved segment and a linear segment. The first curved segment and the second curved segment can be connected by the linear segment. The linear segment can have a length greater than a length of the first curved segment or a length of the second curved segment.

Some examples of the disclosure are directed to an acoustic touch-sensitive device. The acoustic touch-sensitive device can comprise a cover glass and one or more piezoelectric transducers coupled to the cover glass. The one or more piezoelectric transducers can be shear-poled to generate shear acoustic waves in the cover glass. At least one of the one or more piezoelectric transducers can comprise a curved segment and a direction of shear poling in the curved segment follows a curvature of the curved segment. Additionally or alternatively to one or more of the examples disclosed above, in some examples, the one or more piezoelectric transducers comprises a ring-shaped piezoelectric material. Additionally or alternatively to one or more of the examples disclosed above, in some examples, a circumference of the ring-shaped piezoelectric material can be within a threshold of a circumference of the cover glass. Additionally or alternatively to one or more of the examples disclosed above, in some examples, the one or more piezoelectric transducers can comprise four curved piezoelectric transducers disposed at four corners of the cover glass and four linear piezoelectric transducers disposed along edges of the cover glass between the curved piezoelectric transducers.

Some examples of the disclosure are directed to a method of shear poling a curved piezoelectric material. The method can comprise shear poling a plurality of segments of the curved piezoelectric material including poling one or more first segments of the plurality of segments of the curved piezoelectric material during a first time period and shear poling one or more second segments of the plurality of segments of the curved piezoelectric material during a second time period. Additionally or alternatively to one or more of the examples disclosed above, in some examples, shear poling the one or more first segments can comprise applying a first voltage across two respective electrodes disposed on a first surface of the curved piezoelectric material on opposite ends of a respective first segment. Additionally or alternatively to one or more of the examples disclosed above, in some examples, shear poling the one or more first segments can comprise applying a second voltage across two respective electrodes disposed on a second surface of the curved piezoelectric material on opposite ends of the respective first segment. Additionally or alternatively to one or more of the examples disclosed above, in some examples, the method can further comprise coupling a first plurality of poling electrodes to a first surface of the curved piezoelectric material. Additionally or alternatively to one or more of the examples disclosed above, in some examples, the method can further comprise coupling a second plurality of poling electrodes to a second surface of the curved piezoelectric material, the first surface and the second surface on opposite sides of the curved piezoelectric material. Additionally or alternatively to one or more of the examples disclosed above, in some examples, the method can further comprise activating a first subset of the first plurality of poling electrodes by coupling the first subset of the first plurality of poling electrodes to a voltage source and deactivating a second subset of the first plurality of poling electrodes by decoupling the second subset of the first plurality of poling electrodes from the voltage source. Additionally or alternatively to one or more of the examples disclosed above, in some examples, the method can further comprise adjusting a relative position between the first plurality of poling electrodes and the curved piezoelectric material by moving the curved piezoelectric material or by moving the first plurality of poling electrodes. Additionally or alternatively to one or more of the examples disclosed above, in some examples, the adjustment of the relative position between the first plurality of poling electrodes and the curved piezoelectric material can comprise a shift of half the distance between two respective electrodes of the first plurality of poling electrodes. Additionally or alternatively to one or more of the examples disclosed above, in some examples, the adjustment of the relative position between the first plurality of poling electrodes and the curved piezoelectric material can comprise a plurality of shifts. Additionally or alternatively to one or more of the examples disclosed above, in some examples, the first plurality of poling electrodes can be equally spaced along the curved piezoelectric material. Additionally or alternatively to one or more of the examples disclosed above, in some examples, the first plurality of poling electrodes can have a first spacing for linear segments of the curved piezoelectric material and a second spacing for curved segments of the curved piezoelectric material. Additionally or alternatively to one or more of the examples disclosed above, in some examples, the first plurality of poling electrodes can be of equal width along the curved piezoelectric material. Additionally or alternatively to one or more of the examples disclosed above, in some examples, the first plurality of poling electrodes can have a first width for linear segments of the curved piezoelectric material and a second width for curved segments of the piezoelectric material. Some examples of the disclosure are directed to a non-transitory computer readable storage medium. A non-transitory computer readable storage medium can store instructions, which when executed by one or more processors, cause the one or more processors to perform any of the above methods.

Therefore, according to the above, some examples of the disclosure are directed to a curved piezoelectric material prepared by a process. The process can comprise: coupling a plurality of poling electrodes to the curved piezoelectric material and applying a voltage across respective subsets of the plurality of poling electrodes during a plurality of poling periods to shear polarize respective segments of the curved piezoelectric material. A direction of shear poling can match a curvature of the curved piezoelectric material. Additionally or alternatively to one or more of the examples disclosed above, in some examples, the process can further comprise placing the piezoelectric material and plurality of electrodes in an oil bath heated to a temperature above a temperature threshold. Additionally or alternatively to one or more of the examples disclosed above, in some examples, the process can further comprise applying the voltage meeting a threshold voltage across the respective subsets of the plurality of electrodes for a threshold period of time.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

What is claimed is:

1. A piezoelectric material comprising:
   a curved segment, the curved segment coupled to a plurality of electrodes;
   wherein a direction of shear poling by the plurality of electrodes in the curved segment follows a single shear poling direction along a curvature of the curved segment when an opposite voltage is applied to each of a pair of electrodes in the plurality of electrodes, the electrodes in the pair being on a same curved side of the piezoelectric material.

2. The piezoelectric material of claim 1, wherein the piezoelectric material, when excited, generates a threshold percentage of total energy in a selected shear mode.

3. The piezoelectric material of claim 1, wherein the direction of shear poling is within a threshold amount of a line tangential to the curvature of the curved segment.

4. The piezoelectric material of claim 1, wherein the piezoelectric material comprises a closed ring shape.

5. The piezoelectric material of claim 1, wherein the piezoelectric material comprises a circular or a partially circular shape.

6. The piezoelectric material of claim 1, wherein the piezoelectric material comprises a plurality of elbow shaped segments.

7. The piezoelectric material of claim 1, wherein the piezoelectric material comprises a first curved segment, a second curved segment and a linear segment, wherein the first curved segment and the second curved segment are connected by the linear segment, the linear segment having a length greater than a length of the first curved segment or a length of the second curved segment.

8. The piezoelectric material of claim 1, wherein the plurality of electrodes are configured to have a relative position between the plurality of electrodes and the piezoelectric material adjusted by moving the curved piezoelectric material or by moving the plurality of electrodes.

9. An acoustic touch-sensitive device comprising:
   a cover glass; and
   one or more piezoelectric transducers coupled to the cover glass, wherein the one or more piezoelectric transducers are shear-poled to generate shear acoustic waves in the cover glass;
   wherein at least one of the one or more piezoelectric transducers comprises a curved segment and a direction of shear poling in the curved segment follows a single direction of shear poling along a curvature of the curved segment when opposite voltages are applied to each of a pair of electrodes coupled to the curved segment, the electrodes in the pair being on a same curved side of the transducer.

10. The acoustic touch-sensitive device of claim 9, wherein the one or more piezoelectric transducers comprises a ring-shaped piezoelectric material.

11. The acoustic touch-sensitive device of claim 10, wherein a circumference of the ring-shaped piezoelectric material is within a threshold of a circumference of the cover glass.

12. The acoustic touch-sensitive device of claim 9, wherein the one or more piezoelectric transducers comprises four curved piezoelectric transducers disposed at four corners of the cover glass and four linear piezoelectric transducers disposed along edges of the cover glass between the curved piezoelectric transducers.

13. The acoustic touch-sensitive device of claim 9, wherein the plurality of electrodes are configured to have a relative position between the plurality of electrodes and the piezoelectric material adjusted by moving the curved piezoelectric material or by moving the plurality of electrodes.

14. A method of shear poling a curved piezoelectric material, the method comprising:
   shear poling a plurality of segments of the curved piezoelectric material in a single direction along a curvature of a curved segments including poling one or more first segments of the plurality of segments of the curved piezoelectric material during a first time period including applying an opposite voltage to each of a first pair of electrodes coupled to a same curved side of the piezoelectric material and shear poling one or more second segments of the plurality of segments of the curved piezoelectric during a second time period including applying the opposite voltages to each of a second pair of electrodes coupled to a same curved side of the piezoelectric material.

15. The method of claim 14, wherein poling the one or more first segments comprises applying a first voltage across two respective electrodes disposed on a first surface of the curved piezoelectric material on opposite ends of a respective first segment.

16. The method of claim 15, wherein poling the one or more first segments comprises applying a second voltage across two respective electrodes disposed on a second surface of the curved piezoelectric material on opposite ends of the respective first segment.

17. The method of claim 14, further comprising:
   coupling a first plurality of poling electrodes to a first surface of the curved piezoelectric material.

18. The method of claim 17, further comprising:
   coupling a second plurality of poling electrodes to a second surface of the curved piezoelectric material, the first surface and the second surface on opposite sides of the curved piezoelectric material.

19. The method of claim 17, further comprising:
   activating a first subset of the first plurality of poling electrodes by coupling the first subset of the first plurality of poling electrodes to a voltage source;
   deactivating a second subset of the first plurality of poling electrodes by decoupling the second subset of the first plurality of poling electrodes from the voltage source.

20. The method of claim 17, further comprising:
   adjusting a relative position between the first plurality of poling electrodes and the curved piezoelectric material by moving the curved piezoelectric material or by moving the first plurality of poling electrodes.

21. The method of claim 17, wherein the first plurality of poling electrodes have a first spacing for linear segments of the curved piezoelectric material and a second spacing for curved segments of the curved piezoelectric material.

* * * * *